(12) United States Patent
Guan

(10) Patent No.: US 12,426,470 B2
(45) Date of Patent: Sep. 23, 2025

(54) DISPLAY PANEL, MASK ASSEMBLY AND DISPLAY DEVICE

(71) Applicants: Chengdu BOE Optoelectronics Technology Co., Ltd., Sichuan (CN); BOE Technology Group Co., Ltd., Beijing (CN)

(72) Inventor: Xinxing Guan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 519 days.

(21) Appl. No.: 17/922,382

(22) PCT Filed: Aug. 31, 2021

(86) PCT No.: PCT/CN2021/115759
§ 371 (c)(1),
(2) Date: Oct. 31, 2022

(87) PCT Pub. No.: WO2022/042749
PCT Pub. Date: Mar. 3, 2022

(65) Prior Publication Data
US 2023/0247883 A1    Aug. 3, 2023

(30) Foreign Application Priority Data
Aug. 31, 2020   (CN) .......................... 202010900933.1

(51) Int. Cl.
*H10K 59/35*    (2023.01)
*H10K 59/131*    (2023.01)

(52) U.S. Cl.
CPC ......... *H10K 59/353* (2023.02); *H10K 59/131* (2023.02); *H10K 59/352* (2023.02)

(58) Field of Classification Search
CPC .. H10K 59/353; H10K 59/131; H10K 59/352; H10K 59/351; H10K 50/86; H10K 71/166; C23C 14/042; C23C 14/24
See application file for complete search history.

(56) References Cited

U.S. PATENT DOCUMENTS

| | | | |
|---|---|---|---|
| 2013/0234917 A1 | 9/2013 | Lee | |
| 2018/0088260 A1 | 3/2018 | Jin et al. | |

(Continued)

FOREIGN PATENT DOCUMENTS

| | | | |
|---|---|---|---|
| CN | 103311266 A | 9/2013 | |
| CN | 109686778 A | 4/2019 | |

(Continued)

OTHER PUBLICATIONS

International Search Report for PCT/CN2021/115759 Mailed Nov. 25, 2021.

(Continued)

*Primary Examiner* — Donald L Raleigh
(74) *Attorney, Agent, or Firm* — Ling Wu; Stephen Yang; Ling and Yang Intellectual Property

(57) ABSTRACT

A display panel (10), comprising a plurality of pixel units (12) arranged in an array, each pixel unit (12) comprising one first sub-pixel (122), one second sub-pixel (124) and two third sub-pixels (126) located in a virtual hexagon; the first sub-pixel (122) is adjacent to the second sub-pixel (124), and the two third sub-pixels (126) are both adjacent to the first sub-pixel (122) and the second sub-pixel (124); and pixel units (12) adjacent in the column extension direction share the first sub-pixel (122) and the second sub-pixel (124), and pixel units (12) adjacent in a row extension direction share one third sub-pixel (126). The present application further discloses a mask assembly and a display device.

20 Claims, 17 Drawing Sheets

(56) References Cited

U.S. PATENT DOCUMENTS

| | | |
|---|---|---|
| 2019/0252469 A1 | 8/2019 | Xiao et al. |
| 2020/0251536 A1 | 8/2020 | Zhao et al. |
| 2021/0384268 A1* | 12/2021 | Liu ...................... H10K 59/353 |

FOREIGN PATENT DOCUMENTS

| | | |
|---|---|---|
| CN | 110137206 A | 8/2019 |
| CN | 110277436 A | 9/2019 |
| CN | 111987130 A | 11/2020 |
| CN | 212412057 U | 1/2021 |

OTHER PUBLICATIONS

Office Action dated Jan. 18, 2023 for Chinese Patent Application No. 202180002382.X and English Translation.

* cited by examiner

DISPLAY PANEL, MASK ASSEMBLY AND DISPLAY DEVICE

CROSS-REFERENCE TO RELATED APPLICATIONS

The present application is a U.S. National Phase Entry of International Application No. PCT/CN2021/115759 having an international filing date of Aug. 31, 2021, which claims the priority and benefits of the application with the patent application number 202010900933.1 filed to the China National Intellectual Property Administration on Aug. 31, 2020. The above-identified applications are incorporated into this application by reference in their entirety.

TECHNICAL FIELD

The present application relates to the field of display technologies, in particular to a display panel, a mask assembly, and a display apparatus.

BACKGROUND

In related technologies, requirements of users for mobile terminal devices are getting higher and higher, and lighter, thinner, brighter, and more energy-saving are still requirements of most users. An Organic Light Emitting Diode (OLED) display device, with its self-luminous characteristics, can achieve a display function without a backlight source, and thereby becomes a preferred display device for the requirements of lighter and thinner. A structure of the OLED display device mainly includes a base substrate, and sub-pixels arranged in a matrix fabricated on the base substrate. For various sub-pixels, an organic material is generally passed through a high-precision metal mask by using an evaporation film formation technology, and an organic electroluminescent emitting structure is formed at a corresponding sub-pixel position of an array substrate. At present, it is difficult to obtain a high-resolution display device with a traditional Red Green Blue (RGB) pixel arrangement structure.

SUMMARY

Implementations of the present application provide a display panel, a mask assembly, and a display apparatus.

A display panel of an implementation of the present application includes multiple pixel units arranged in an array, each of the pixel units includes a first sub-pixel, a second sub-pixel, and two third sub-pixels located in a virtual polygon, wherein a quantity of sides of the virtual polygon is greater than or equal to five; the first sub-pixel is adjacent to the second sub-pixel, and both the two third sub-pixels are adjacent to the first sub-pixel and the second sub-pixel; pixel units adjacent in a column extension direction share the first sub-pixel and the second sub-pixel, and pixel units adjacent in a row extension direction share one of the third sub-pixels.

In some implementations, in the pixel unit, a distance between a geometric center of each of the third sub-pixels and a geometric center of the first sub-pixel is equal to a distance between the geometric center of the third sub-pixel and a geometric center of the second sub-pixel.

In some implementations, the virtual polygon is a virtual hexagon, the virtual hexagon includes two opposite short sides which are perpendicular to the column extension direction, the first sub-pixel and the second sub-pixel are respectively disposed to fit the two short sides, and the two third sub-pixels are respectively disposed at two diagonal angles formed by other four sides of the virtual hexagon.

In some implementations, the two third sub-pixels are in mirror distribution with respect to a midline of a short side, or the two third sub-pixels are symmetrically distributed with respect to a center of the virtual hexagon.

In some implementations, first sub-pixels and second sub-pixels of the multiple pixel units are alternately arranged in row extension directions, and centers of first sub-pixels and centers of second sub-pixels in a same row are on a same straight line; the first sub-pixels and the second sub-pixels of the multiple pixel units are alternately arranged in column extension directions, and centers of first sub-pixels and centers of second sub-pixels in a same column are on a same straight line.

In some implementations, a spacing between the first sub-pixel and the second sub-pixel and a spacing between the first sub-pixel and the third sub-pixel are equal.

In some implementations, a spacing between the second sub-pixel and the third sub-pixel and a spacing between the first sub-pixel and the third sub-pixel are equal.

In some implementations, the first sub-pixel and the second sub-pixel are hexagonal and the third sub-pixel is quadrilateral.

In some implementations, a color of light emitted by the first sub-pixel and a color of light emitted by the second sub-pixel and a color of light emitted by the third sub-pixel are different from one another.

In some implementations, the first sub-pixel emits red light, the second sub-pixel emits blue light, and the third sub-pixel emits green light; or the first sub-pixel emits blue light, the second sub-pixel emits red light, and the third sub-pixel emits green light.

In some implementations, the pixel units are arranged in a rectangular lattice, virtual polygons where pixel units sharing the first sub-pixel or the second sub-pixel are located in the display panel intersect, and arrangement orders of first sub-pixels and second sub-pixels of pixel units in a same row in two adjacent columns of pixel units are reserve along column extension directions.

A display panel of another implementation of the present application includes multiple pixel units arranged in an array, each of the pixel units includes a first sub-pixel, a second sub-pixel, and two third sub-pixels located in a virtual polygon, wherein a quantity of sides of the virtual polygon is greater than or equal to five; the first sub-pixel is adjacent to the second sub-pixel, and both the two third sub-pixels are adjacent to the first sub-pixel and the second sub-pixel; a geometric center of the first sub-pixel in the pixel unit has a same first distance from each of geometric centers of the two third sub-pixels, and a geometric center of the second sub-pixel has a same second distance from each of the geometric centers of the two third sub-pixels; the geometric centers of the two third sub-pixels of the pixel unit have a first connection line, a ratio of a distance between a center of the first sub-pixel and the first connection line to a distance between the geometric center of the second sub-pixel and the first connection line is a first preset value, a ratio of a maximum size of the first sub-pixel in a row extension direction to a maximum size of the second sub-pixel in the row extension direction is a second preset value, and the first preset value is smaller than the second preset value; the geometric center of the first sub-pixel and the geometric center of the second sub-pixel in the pixel unit have a second connection line, a farthest distance between two straight lines passing through the first sub-pixel and the second sub-pixel along a direction parallel to the second connection line but not through the third sub-pixels is a third distance, the geometric center of the first sub-pixel and a geometric center of the third sub-pixel in the pixel unit have a third connection line, a farthest distance between two straight lines passing through the first sub-pixel and the third sub-pixel along a direction parallel to the third connection line but not through the second sub-pixel is a fourth distance, and a ratio of the third distance to the fourth distance is less than 1.5.

In some implementations, the first distance and the second distance are equal.

In some implementations, in the pixel unit, a spacing between the first sub-pixel and the second sub-pixel is greater than a spacing between the first sub-pixel and the third sub-pixel, and/or a spacing between the first sub-pixel and the second sub-pixel is greater than a spacing between the second sub-pixel and the third sub-pixel.

In some implementations, a spacing between the first sub-pixel and the third sub-pixel and a spacing between the second sub-pixel and the third sub-pixel in the pixel unit are equal.

In some implementations, a shape of the pixel unit is designed as axis symmetry.

In some implementations, the two third sub-pixels in the pixel unit are designed symmetrically with respect to a line where a geometric center of the first sub-pixel and a geometric center of the second sub-pixel are located.

In some implementations, the two third sub-pixels in the pixel unit have a same shape and size.

In some implementations, a shape of the first sub-pixel is designed as axis symmetry.

In some implementations, a shape of the second sub-pixel is designed as axis symmetry.

In some implementations, the first sub-pixel in the pixel unit includes a side adjacent to a third sub-pixel, the side forms an included angle with an extension direction of the adjacent third sub-pixel, an angle range of the included angle is greater than or equal to 0° and less than or equal to 30°.

In some implementations, in the pixel unit, a size of a side of the first sub-pixel close to the second sub-pixel in the row extension direction is smaller than that of a side of the first sub-pixel away from the second sub-pixel in the row extension direction.

In some implementations, in the pixel unit, a size of a side of the first sub-pixel close to the second sub-pixel in the row extension direction is smaller than a maximum size of the first sub-pixel in the row extension direction.

In some implementations, in the pixel unit, a connection line of a geometric center of one of the third sub-pixels and the geometric center of the second sub-pixel forms a first angle with a connection line of the geometric center of the second sub-pixel and a geometric center of the other one of the third sub-pixels, and a range of the first angle is 60° to 150°.

In some implementations, in the pixel unit, a connection line of the geometric center of one of the third sub-pixels and the geometric center of the first sub-pixel forms a second angle with a connection line of the geometric center of the first sub-pixel and the geometric center of the other one of the third sub-pixels, and the second angle is larger than the first angle.

In some implementations, a shape of the first sub-pixel includes a triangle, a quadrilateral, a pentagon, a sector, or an irregular pattern, a shape of the second sub-pixel includes a quadrilateral, a pentagon, a sector, or an irregular pattern, and a shape of the third sub-pixel includes a quadrilateral or an irregular pattern.

In some implementations, a sum of mutually adjacent internal angles of the first sub-pixel, the second sub-pixel, and the two third sub-pixels in the pixel unit ranges from 300° to 400°.

In some implementations, in the pixel unit, a projection of the first sub-pixel along the row extension direction is overlapped with a projection of the third sub-pixel along the row extension direction, a portion where the projection of the first sub-pixel along the row extension direction is overlapped with the projection of the third sub-pixel along the row extension direction is larger than a portion where the projection of the first sub-pixel along the row extension direction is not overlapped with the projection of the third sub-pixel along the row extension direction.

In some implementations, the virtual polygon is a virtual pentagon, a first side of the first sub-pixel is disposed along a first side of the virtual pentagon, a second side and a third side of the first sub-pixel are respectively disposed opposite to first sides of the two third sub-pixels, second sides of the two third sub-pixels are respectively disposed along a second side and a third side of the virtual pentagon, third sides of the two third sub-pixels are respectively disposed along a fourth side and a fifth side of the virtual pentagon, and fourth sides of the two third sub-pixels are disposed opposite to the second sub-pixel.

In some implementations, the second sub-pixel is substantially quadrilateral, a first side and second side, that are adjacent, of the second sub-pixel are respectively disposed opposite to the fourth sides of the two third sub-pixels, and a third side and fourth side, that are adjacent, of the second sub-pixel are respectively disposed opposite to the fourth side and the fifth side of the virtual pentagon.

In some implementations, lengths of the fourth sides of the two third sub-pixels are equal or unequal.

In some implementations, the second sub-pixel is substantially fan-shaped and two straight sides of the second sub-pixel are respectively disposed opposite to the fourth sides of the two third sub-pixels.

In some implementations, the virtual polygon is a virtual pentagon, a first side of the first sub-pixel is disposed along a first side of the virtual pentagon, a second side and a third side of the first sub-pixel are respectively disposed opposite to the first sides of the two third sub-pixels, a fourth side of the first sub-pixel is disposed opposite to a first side of the second sub-pixel, second sides of the two third sub-pixels are respectively disposed along a second side and a third side of the virtual pentagon, third sides of the two third sub-pixels are respectively disposed along a fourth side and a fifth side of the virtual pentagon, fourth sides of the two third sub-pixels are disposed opposite to a second side and a third side of the second sub-pixel, respectively, and a fourth side and a fifth side of the second sub-pixel are disposed along the fourth side and the fifth side of the virtual pentagon, respectively.

In some implementations, the virtual polygon is a virtual hexagon, a first side of the first sub-pixel is disposed along a first side of the virtual hexagon, a second side and a third side of the first sub-pixel are respectively disposed opposite to first sides of the two third sub-pixels, second sides of the two third sub-pixels are respectively disposed along a second side and a third side of the virtual hexagon, third sides of the two third sub-pixels are respectively disposed along a fourth side and a fifth side of the virtual hexagon, fourth sides of the two third sub-pixels are disposed opposite to a first side and a second side of the second sub-pixel, a third side and a fourth side of the second sub-pixel are disposed along the fourth side and the fifth side of the virtual hexagon, respectively, and a fifth side of the second sub-pixel is disposed along a sixth side of the virtual hexagon.

In some implementations, the third sub-pixel is substantially rectangular or trapezoidal. In some implementations, a ratio of a length of the second side of the third sub-pixel to a length of the fourth side of the third sub-pixel ranges from 0.5 to 2.

In some implementations, a connection line of a midpoint of the second side and a midpoint of the fourth side in the third sub-pixel passes through a geometric center of the third sub-pixel.

In some implementations, a color of light emitted by the first sub-pixel and a color of light emitted by the second sub-pixel and a color of light emitted by the third sub-pixel are different from one another.

In some implementations, the first sub-pixel emits blue light, the second sub-pixel emits red light, and the third sub-pixel emits green light, an area of the first sub-pixel is larger than an area of the third sub-pixel, the area of the third sub-pixel is larger than an area of the second sub-pixel.

In some implementations, the pixel units are arranged in a rectangular lattice, virtual polygons in which various pixel units are located in the display panel do not intersect with each other, and first sub-pixels and second sub-pixels in the pixel units are arranged in a same order along column extension directions.

In some implementations, the pixel units are arranged in a rectangular lattice, virtual polygons in which various pixel units are located in the display panel do not intersect with each other, and arrangement orders of first sub-pixels and second sub-pixels of pixel units in a same row in two adjacent columns of pixel units along column extension directions are reverse.

In some implementations, the pixel units are arranged in a triangular lattice, virtual polygons in which various pixel units are located in the display panel do not intersect with each other, and arrangement orders of first sub-pixels and second sub-pixels in the pixel units along column extension directions are the same.

A mask assembly of an implementation of the present application is used for fabricating the display panel described in any of the above implementations, the mask assembly includes a first mask, a second mask, and a third mask, the first mask includes a first substrate and a first opening provided on the first substrate, the first opening corresponds to the first sub-pixel, the second mask includes a second substrate and a second opening provided on the second substrate, the second opening corresponds to the second sub-pixel, and the third mask includes a third substrate and a third opening provided on the third substrate, the third opening corresponds to the third sub-pixel.

A display apparatus according to an implementation of the present application includes the display panel according to any of the above implementations.

In a display panel and a display apparatus fabricated through a mask assembly according to an implementation of the present application, four sub-pixels together constitute an independent light emitting unit, and within a virtual pentagon, a geometric center of a first sub-pixel has a same first distance from each of geometric centers of two third sub-pixels, a geometric center of a second sub-pixel has a same second distance from each of geometric centers of two third sub-pixels, so that sub-pixels are uniformly distributed, and a display effect is ensured through distribution of sub-pixels in a pixel unit and designs of the first distance and the second distance.

Additional aspects and advantages of the implementations of the present application will be partially shown in following description, or a part of additional aspects and advantages of the implementations of the present application become apparent in following description, or will be learned from practice of the implementations of the present application.

BRIEF DESCRIPTION OF DRAWINGS

The above and/or additional aspects and advantages of the present application will become apparent and easy to understand from following description of implementations in conjunction with accompanying drawings.

DETAILED DESCRIPTION

Figure 1:
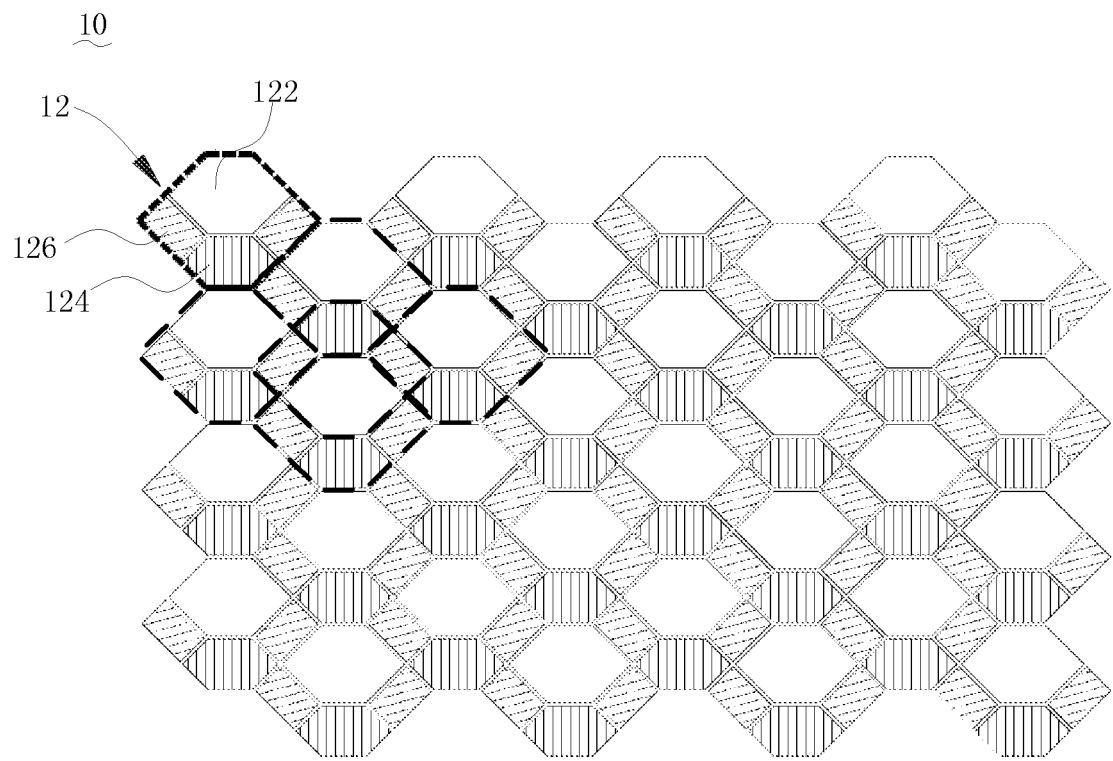
FIG. 1 is a schematic diagram of a structure of a display panel according to an implementation of the present application.

Implementations of the present application will be described in detail below, examples of the implementations are shown in the accompanying drawings, in which same or similar reference numerals refer to same or similar elements or elements with same or similar functions throughout. The implementations described herein with reference to the accompanying drawings are exemplary, only used for explaining the present application, and should not be construed to limit the present application.

In the description of the present application, it should be understood that terms "first", "second", and etc. are used for a purpose of description only, and cannot be understood as indicating or implying relative importance or implicitly indicating a quantity of indicated technical features. Therefore, a feature defined by "first" and "second" may explicitly or implicitly includes one or more features. In the description of the present application, a meaning of "multiple" is two or more than two, unless otherwise explicitly limited.

In the following, many different implementations or examples are provided for implementing different structures of the present application. In order to simplify the disclosure of the present application, components and arrangements of specific examples are described below. Of course, they are examples only and are not intended to limit the present application. In addition, in the present application, reference numbers and/or reference letters may be repeated in different examples. This repetition is for a purpose of simplification and clarity, and it does not indicate a relationship between various implementations and/or arrangements discussed. In addition, examples of various specific processes and materials are provided in the present application, but those of ordinary skill in the art will be aware of applications of other processes and/or usages of other materials.

Figure 2:
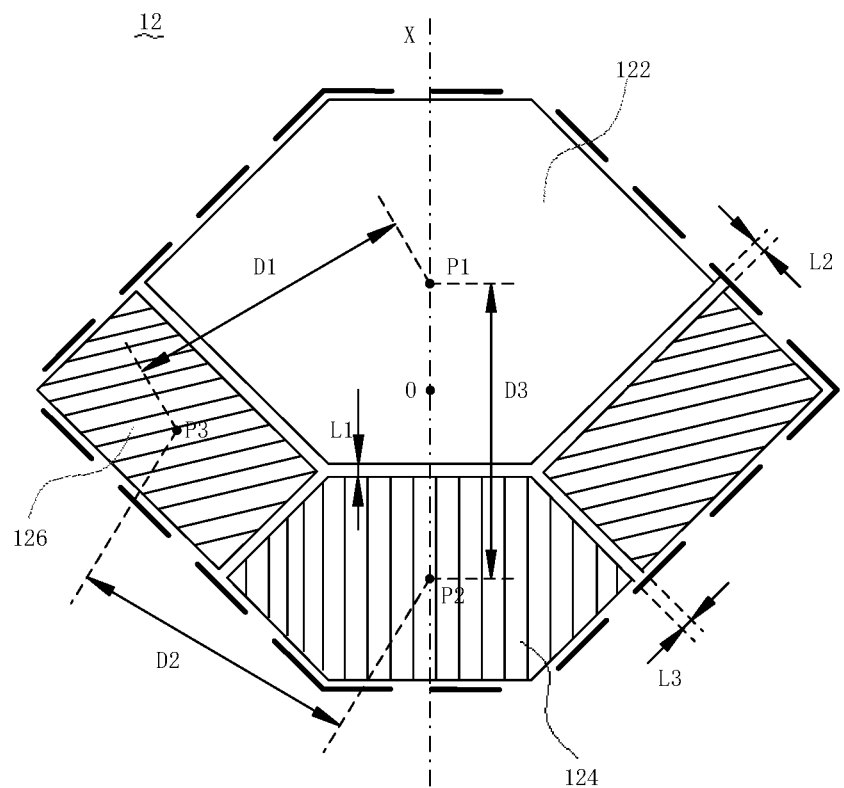
FIG. 2 is a schematic diagram of a structure of a pixel unit according to an implementation of the present application.

Referring to FIGS. 1 and 2, in one embodiment, an implementation of the present application provides a display panel 10 including multiple pixel units 12 arranged in an array. Each pixel unit 12 includes a first sub-pixel 122, a second sub-pixel 124, and two third sub-pixels 126 located within a virtual hexagon. The first sub-pixel 122 is adjacent to the second sub-pixel 124, and the two third sub-pixels 126 are both adjacent to the first sub-pixel 122 and the second sub-pixel 124. Adjacent pixel units 12 in a column extension direction share a first sub-pixel 122 and a second sub-pixel 124, and adjacent pixel units 12 in a row extension direction share a third sub-pixel 126.

In the display panel 10 of the implementation of the present application, any one first sub-pixel 122 may constitute an independent pixel unit 12 together with a second sub-pixel 124 adjacent to the first sub-pixel 122 and two third sub-pixels 126 adjacent to the first sub-pixel 122 and the second sub-pixel 124. Therefore, a high-resolution display effect may be achieved from a low-resolution physical resolution through a principle of color borrowing among sub-pixels. Herein, a sub-pixel is adjacent to a sub-pixel, which means that a connection line with a minimum distance between two sub-pixels does not pass through other sub-pixels.

It should be noted that a pixel unit 12 refers to a minimum repetitive unit, that may be used for achieving a same light emitting effect and function, in the display panel 10, and multiple pixel units 12 being arranged in an array indicates that centers of the multiple pixel units 12 are crossed along at least two directions to form an array. Particularly, multiple pixel units 12 may be interleaved along two directions perpendicular to each other to be arranged in an array. In this case, the two directions perpendicular to each other may be a row extension direction and a column extension direction of pixel units 12, respectively, pixel units 12 arranged along the row extension direction form pixel rows, and pixels arranged along the column extension direction form pixel columns. Herein, rows and columns of pixel units 12 arranged in the display panel 10 are relative. Pixel units 12 arranged in a row in this implementation may be pixel units 12 arranged in a column in another implementation, and details will not be described here.

In some examples, a current pixel unit 12 that is not at a start position or an end position in each pixel column may have two adjacent pixel units 12, the current pixel unit 12 may share a first sub-pixel 122 with an adjacent pixel unit 12, and the current pixel unit 12 may share a second sub-pixel 124 with another adjacent pixel unit 12. Accordingly, a current pixel unit 12 that is not at a start position or an end position in each pixel row may have two adjacent pixel units 12, the current pixel unit 12 may share a third sub-pixel 126 of the current pixel unit 12 with an adjacent pixel unit 12, and the current pixel unit 12 may share the other third sub-pixel 126 of the current pixel unit 12 with another adjacent pixel unit 12.

In this case, a first sub-pixel 122, a second sub-pixel 124, and two third sub-pixels 126 in a pixel unit 12 that is not at a start position or an end position of a pixel row or a pixel column, all achieve sharing with an adjacent pixel unit 12, so that a high-resolution display effect may be achieved from a low-resolution physical resolution through a principle of a color borrowing among sub-pixels.

In some embodiments, virtual polygons where pixel units 12 sharing a first sub-pixel 122 or a second sub-pixel 124 are located within the display panel 10 intersect.

Further, in some implementations, a virtual polygon is a virtual hexagon.

In some implementations, first sub-pixels 122 and second sub-pixels 124 of multiple pixel units 12 are alternately arranged in row extension directions and centers of first sub-pixels 122 and centers of second sub-pixels 124 in a same row are on a same straight line; or first sub-pixels 122 and second sub-pixels 124 of multiple pixel units 12 are alternately arranged in column extension directions and centers of first sub-pixels 122 and centers of second sub-pixels 124 in a same column are on a same straight line.

Referring again to FIG. 1, in some implementations, pixel units 12 are arranged in a rectangular lattice, and arrangement orders of first sub-pixels 122 and second sub-pixels 124 in a same row of pixel units 12 in two adjacent columns of pixel units 12 are reverse in a column extension direction. For example, in two adjacent columns of pixel units 12, a first sub-pixel 122 and a second sub-pixel 124 of one pixel unit 12 in a same row are arranged from top to bottom along a column extension direction, a first sub-pixel 122 and a second sub-pixel 124 of the other pixel unit 12 are arranged from bottom to top along the column extension direction, so that first sub-pixels 122 and second sub-pixels 124 of multiple pixel units 12 in a same row in the entire display panel 10 are alternately arranged in a row extension direction.

Referring to FIG. 2, in some implementations, in a pixel unit 12, a distance D1 between a geometric center of each third sub-pixel 126 and a geometric center of a first sub-pixel 122 is equal to a distance D2 between the geometric center of the third sub-pixel 126 and a geometric center of a second sub-pixel 124.

Thus, in the display panel 10, by designing distances between geometric centers of various sub-pixels in a pixel unit 12, a third sub-pixel 126 may be closely arranged with a first sub-pixel 122 and a second sub-pixel 124 according to a predetermined rule, and a spacing between adjacent pixels may be reduced as much as possible.

In some implementations, a distance D3 between the geometric center of the first sub-pixel 122 and the geometric center of the second sub-pixel 124 may be greater than the distance D1 between the geometric center of the third sub-pixel 126 and the geometric center of the first sub-pixel 122 and the distance D2 between the geometric center of the third sub-pixel 126 and the geometric center of the second sub-pixel 124. Or, a distance D3 between the geometric center of the first sub-pixel 122 and the geometric center of the second sub-pixel 124 may be equal to the distance D1 between the geometric center of the third sub-pixel 126 and the geometric center of the first sub-pixel 122 and the distance D2 between the geometric center of the third sub-pixel 126 and the geometric center of the second sub-pixel 124. Or, a distance D3 between the geometric center of the first sub-pixel 122 and the geometric center of the second sub-pixel 124 may be smaller than the distance D1 between the geometric center of the third sub-pixel 126 and the geometric center of the first sub-pixel 122 and the distance D2 between the geometric center of the third sub-pixel 126 and the geometric center of the second sub-pixel 124.

In the implementation of the present application, first sub-pixels 122 and second sub-pixels 124 are arranged along column directions and sharing of first sub-pixels 122 or second sub-pixels 124 in adjacent pixel units 12 along column directions is achieved, while sharing of third sub-pixels 126 in adjacent pixel units 12 along row directions is achieved. It may be understood that the distance D3 between the geometric center of the first sub-pixel 122 and the geometric center of the second sub-pixel 124 may be equal or unequal to the distance D1 between the geometric center of the third sub-pixel 126 and the geometric center of the first sub-pixel 122 and the distance D2 between the geometric center of the third sub-pixel 126 and the geometric center of the second sub-pixel 124. Specifically, the distance D3 between the geometric center of the first sub-pixel 122 and the geometric center of the second sub-pixel 124 may be determined according to a size of the virtual hexagon, shapes and sizes of the first sub-pixel 122 and the second sub-pixel 124, and relative positions of the first sub-pixel 122, the second sub-pixel 124, and the third sub-pixel 126, and the like.

Of course, in some other implementations, the design for distances between centers of various sub-pixels within a pixel unit 12 may also be applied in a design for a geometric center of a light emitting region of the pixel unit, which is not specifically limited here.

In some implementations, the virtual hexagon includes two opposite short sides perpendicular to a column extension direction, a first sub-pixel 122 and a second sub-pixel 124 are respectively disposed to fit the two short sides, and two third sub-pixels 126 are respectively disposed at two diagonal angles formed by the other four sides of the virtual hexagon.

It may be understood that one side of the first sub-pixel 122 may coincide with one short side of the virtual hexagon, one side of the second sub-pixel 124 may coincide with the other short side of the virtual hexagon, and adjacent sides of the second sub-pixel 124 and the first sub-pixel 122 are opposite to the two short sides of the virtual hexagon, respectively. One third sub-pixel 126 is disposed within the virtual hexagon, one angle of the third sub-pixel 126 coincides with one of two diagonal angles formed by the other four sides of the virtual hexagon, one angle of the other third sub-pixel 126 coincides with the other one of the two diagonal angles formed by the other four sides of the virtual hexagon. In this case, two sides of a third sub-pixel 126 forming a corresponding included angle are parallel to two sides of the virtual hexagon forming a corresponding diagonal angle, respectively.

In some implementations, the other four sides of the virtual hexagon form two opposite right angles.

Figure 3:
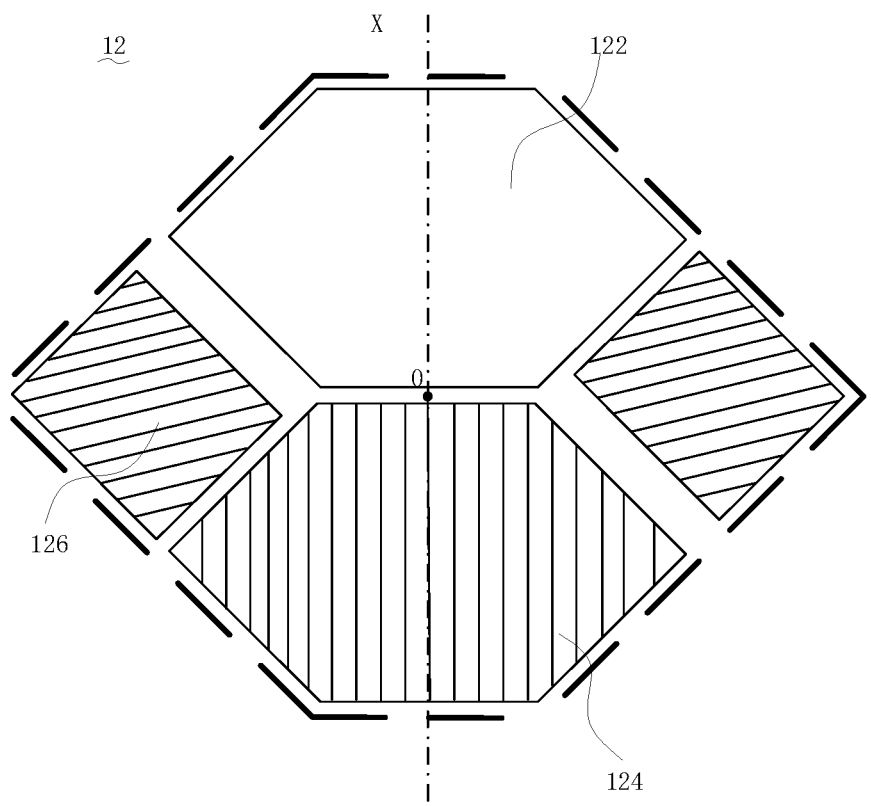
FIG. 3 is a schematic diagram of another structure of a pixel unit according to an implementation of the present application.
Figure 4:
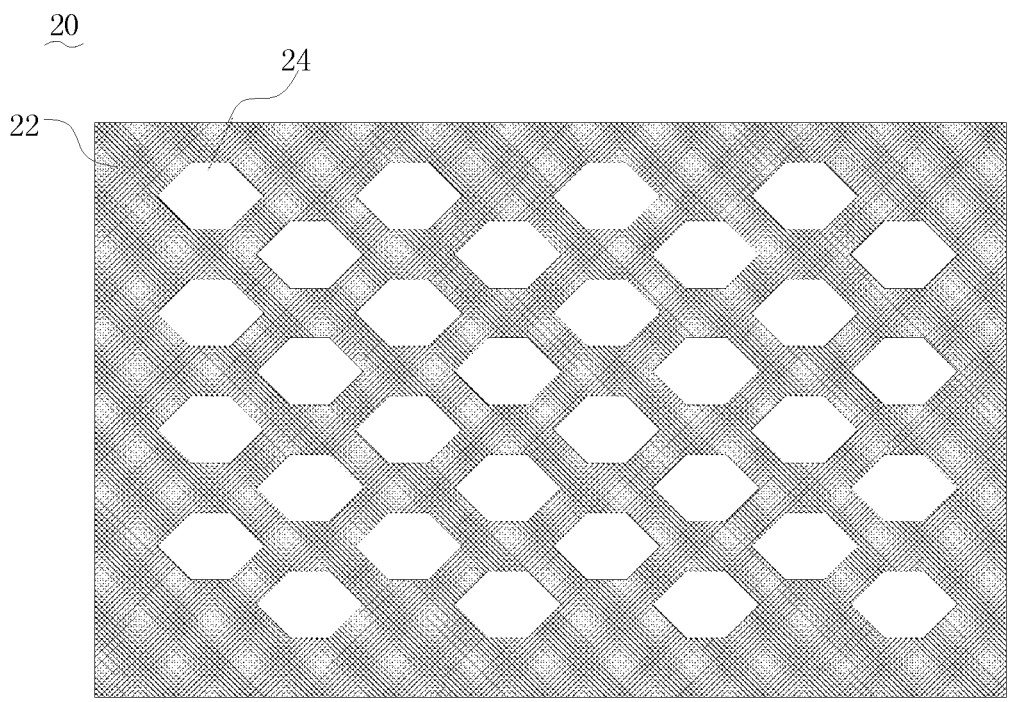
FIG. 4 is a schematic diagram of a structure of a first mask according to an implementation of the present application.
Figure 5:
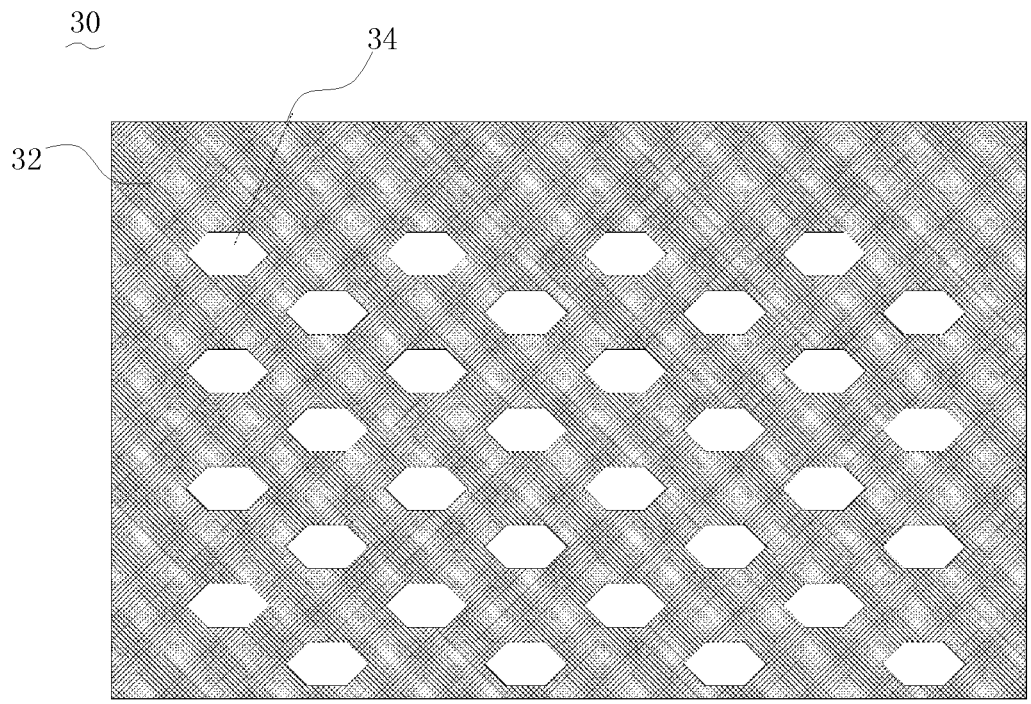
FIG. 5 is a schematic diagram of a structure of a second mask according to an implementation of the present application.
Figure 6:
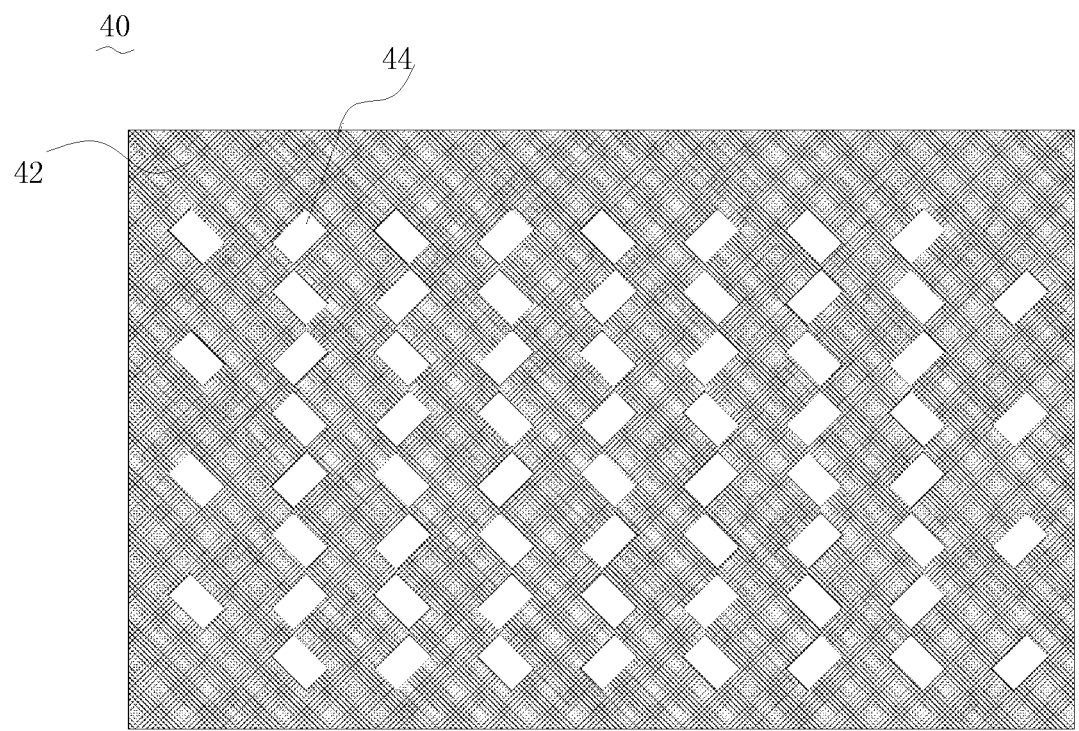
FIG. 6 is a schematic diagram of a structure of a third mask according to an implementation of the present application.

Referring to FIGS. 2 and 3, in some implementations, two third sub-pixels 126 are mirror-distributed with respect to a midline X of a short side, or two third sub-pixels 126 are symmetrically distributed with respect to a center O of the virtual hexagon.

In an embodiment shown in FIG. 2, two third sub-pixels 126 are mirror-distributed with respect to a midline X of a short side. In an embodiment of FIG. 3, two third sub-pixels 126 are symmetrically distributed with respect to a center O of the virtual hexagon.

Referring again to FIG. 2, in some implementations, a spacing L1 between a first sub-pixel 122 and a second sub-pixel 124 and a spacing L2 between the first sub-pixel 122 and a third sub-pixel 126 are equal.

Specifically, a spacing L between sub-pixels refers to a minimum distance between edges, which are close to each other, of sub-pixels. The distance is smaller than a distance D between geometric centers of two sub-pixels. A spacing L1 between a first sub-pixel 122 and its adjacent second sub-pixel 124 needs to be greater than or equal to a process limit distance, and a spacing L2 between the first sub-pixel 122 and its adjacent third sub-pixel 126 needs to be greater than or equal to the process limit distance, to meet process requirements. Moreover, the spacing L between sub-pixels is generally the process limit distance. In this way, in the display panel 10, a spacing between a first sub-pixel 122 and a second sub-pixel 124 can be reduced as much as possible. Therefore, under a condition of a same resolution, a pixel opening area can be increased at a position where the first sub-pixel 122 is adjacent to the second sub-pixel 124 and a position where the first sub-pixel 122 is adjacent to a third sub-pixel 126, a drive current of a display device can be reduced, and further life of the display device can be prolonged.

In some implementations, a spacing L3 between a second sub-pixel 124 and a third sub-pixel 126 and a spacing L1 between a first sub-pixel 122 and the third sub-pixel 126 are equal.

Herein, a spacing L3 between a second sub-pixel 124 and its adjacent third sub-pixel 126 needs to be greater than or equal to a process limit distance, to meet process requirements. Similarly, under a condition of a same resolution, a pixel opening area can be increased at a position where the second sub-pixel 124 is adjacent to the third sub-pixel 126 and a position where a first sub-pixel 122 is adjacent to the third sub-pixel 126, a drive current of a display device can be reduced, and further life of the display device can be prolonged.

In some implementations, a spacing L2 between a first sub-pixel 122 and a third sub-pixel 126 and a spacing L3 between a second sub-pixel 124 and the third sub-pixel 126 are equal.

Similarly, under a condition of a same resolution, a pixel opening area can be increased at a position where the first sub-pixel 122 is adjacent to the third sub-pixel 126 and a position where the second sub-pixel 124 is adjacent to the third sub-pixel 126, a drive current of a display device can be reduced, and further life of the display device can be prolonged.

In some implementations, a spacing L1 between a first sub-pixel 122 and a second sub-pixel 124, a spacing L2 between the first sub-pixel 122 and a third sub-pixel 126, and a spacing L3 between the second sub-pixel 124 and the third sub-pixel 126 are all equal.

In this case, L1=L2=L3, that is to say, a spacing between any two adjacent sub-pixels is equal. In this way, an opening area of all sub-pixels can be further increased, a drive current of a display device can be reduced, and life of the display device can be further increased.

In some implementations, a first sub-pixel 122 and a second sub-pixel 124 are hexagonal and a third sub-pixel 126 is quadrilateral. Thus, in the display panel 10, two opposite sides of the first sub-pixel 122 among six sides are adjacent to two second sub-pixels 124, respectively, and the other four sides of the first sub-pixel 122 are adjacent to four third sub-pixels 126, respectively. Similarly, two opposite sides of the second sub-pixel 124 among six sides are adjacent to the two first sub-pixels 122, respectively, and the other four sides of the second sub-pixel 124 are adjacent to four third sub-pixels 126, respectively. A third sub-pixel 126 is adjacent to two first sub-pixels 122 respectively at a set of opposite sides and the third sub-pixel 126 is adjacent to two second sub-pixels 124 respectively at another set of opposite sides.

Of course, in other implementations, a first sub-pixel 122, a second sub-pixel 124, and a third sub-pixel 126 are not limited to shapes discussed above, but one or more of quadrilateral, hexagonal, and octagonal shapes may be selected according to actual needs, which is not specifically limited here.

In some implementations, various sub-pixels may be provided with chamfers at edge corners.

In some implementations, a color of light emitted by a first sub-pixel 122 and a color of light emitted by a second sub-pixel 124 and a color of light emitted by a third sub-pixel 126 are different from one another.

Further, light emitted by sub-pixels in each pixel unit 12 includes red light, green light, and blue light. The display panel 10 can achieve normal display of a full-color image by uniformly distributing sub-pixels with different colors.

In one example, a first sub-pixel 122 emits red light, a second sub-pixel 124 emits blue light, and a third sub-pixel 126 emits green light. In another example, a first sub-pixel 122 emits blue light, a second sub-pixel 124 emits red light, and a third sub-pixel 126 emits green light.

In some implementations, an area of a first sub-pixel 122 is greater than an area of a second sub-pixel 124, and the area of the second sub-pixel 124 is greater than an area of a third sub-pixel 126.

Particularly, for an organic light emitting diode display device, an area of a blue sub-pixel may be larger than that of a red sub-pixel and a green sub-pixel because a blue light emitting material generally has a lowest light emitting efficiency and a relatively short lifetime compared with a red light emitting material and a green light emitting material. In addition, since human eyes are more sensitive to green and the green light emitting material has a highest efficiency, an area of a green sub-pixel may be the smallest.

Of course, in other implementations, a correspondence of light emitting colors of a first sub-pixel 122, a second sub-pixel 124, and a third sub-pixel 126 may not be limited to the implementations discussed above, but may be changed according to actual needs, which is not specifically limited here.

In combination with FIGS. 1 to 5, a mask assembly (not shown in the figures) provided by an implementation of the present application may be used for fabricating the display panel 10 of any of the above implementations. The mask assembly includes a first mask 20, a second mask 30, and a third mask 40. The first mask 20 includes a first substrate 22 and a first opening 24 opened on the first substrate 22, and the first opening 24 corresponds to a first sub-pixel 122. The second mask 30 includes a second substrate 32 and a second opening 34 opened on the second substrate 32, and the second opening 34 corresponds to a second sub-pixel 124. The third mask 40 includes a third substrate 42 and a third opening 44 opened on the third substrate 42, and the third opening 44 corresponds to a third sub-pixel 126.

The mask assembly according to the implementation of the present application may be fabricated to form the display panel 10. Any first sub-pixel 122 of the display panel 10 may constitute an independent pixel unit 12 together with a second sub-pixel 124 adjacent to the first sub-pixel 122 and two third sub-pixels 126 adjacent to the first sub-pixel 122 and the second sub-pixel 124, therefore, a high-resolution display effect may be achieved from a low-resolution physical resolution through a principle of color borrowing among sub-pixels.

In some implementations, the first substrate 22, the second substrate 32, and the third substrate 42 are made of a metal material. In this way, the first mask 20, the second mask 30, and the third mask 40 may be high-precision metal masks, and may be applied to an evaporation process to form a corresponding display panel 10 by evaporating an organic light emitting material corresponding to a pixel pattern.

In some implementations, the mask assembly further includes a Cover Mask, a Howling Mask, and an Align Mask. The first mask 20, the second mask 30, and the third mask 40 may all be combined with the cover mask, the howling mask, and the align mask to form a Mask Frame Assembly (MFA). In this way, a combined Mask Frame Assembly may be respectively placed into a corresponding evaporation chamber to evaporate an organic light emitting material corresponding to a sub-pixel. Specifically, a pattern of a sub-pixel may be formed each time by evaporation, a pattern of another sub-pixel is formed after a pattern of one sub-pixel is formed, and patterns of three sub-pixels are formed sequentially to obtain the display panel 10 according to the implementation of the present application.

Of course, in some other implementations, it is not limited to use an evaporation process to form the display panel 10, and a photolithography process, an etching process, or the like may be used as required to form the display panel 10.

A display apparatus according to an implementation of the present application includes the display panel 10 according to any of the above implementations.

In the display apparatus of the implementation of that present application, any first sub-pixel 122 of the display panel 10 may constitute an independent pixel unit 12 together with a second sub-pixel 124 adjacent to the first sub-pixel 122 and two third sub-pixels 126 adjacent to the first sub-pixel 122 and the second sub-pixel 124. Therefore, a high-resolution display effect may be achieved from a low-resolution physical resolution through a principle of color borrowing among sub-pixels.

Figure 7:
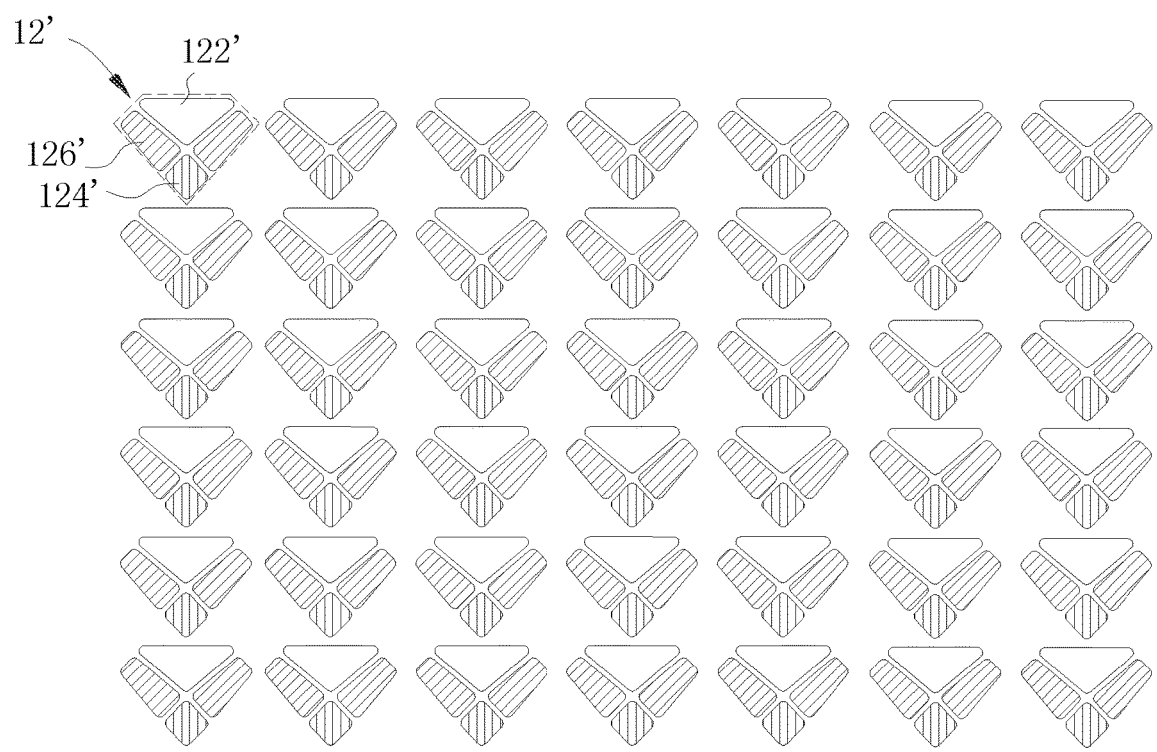
FIG. 7 is a schematic diagram of a pixel arrangement structure of a display panel according to an implementation of the present application.
Figure 8:
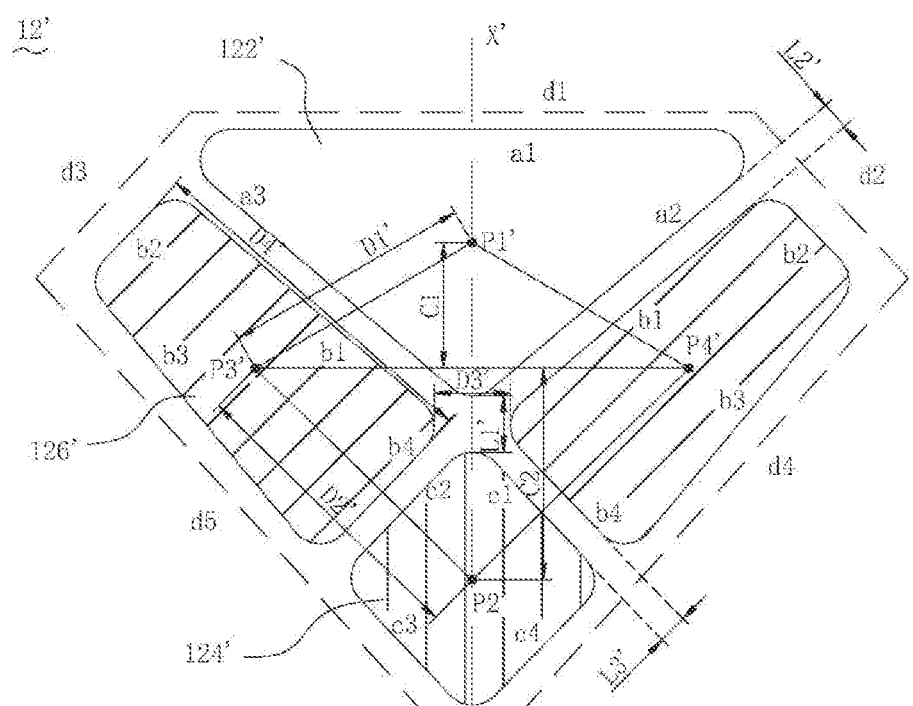
FIG. 8 is a schematic diagram of a structure of a pixel unit according to an implementation of the present application.

In another embodiment, referring to FIGS. 7 and 8, an implementation of the present application also provides a display panel 10'. The display panel 10' includes multiple pixel units 12' arranged in an array, each pixel unit 12' includes a first sub-pixel 122', a second sub-pixel 124', and two third sub-pixels 126' located within a virtual polygon. The first sub-pixel 122' and the second sub-pixel 124' are adjacent. A quantity of sides of the virtual polygon is greater than or equal to five. The two third sub-pixels 126' are both adjacent to the first sub-pixel 122' and the second sub-pixel 124'. In the pixel unit 12', distances from a geometric center P1' of the first sub-pixel 122' to geometric centers of the two third sub-pixels 126' are a same first distance D1', and distances from a geometric center P2' of the second sub-pixel 124' to the geometric centers of the two third sub-pixels 126' are a same second distance D2'. Geometric centers P3' and P4' of two third sub-pixels 126' of the pixel unit 12' have a first connection line P3'P4', a ratio of a distance C1 between the geometric center P1' of the first sub-pixel 122' and the first connection line P3'P4' to a distance C2 between the geometric center P2' of the second sub-pixel 124' and the first connection line P3'P4' is a first preset value. A ratio of a maximum size of the first sub-pixel 122' in a row extension direction to a maximum size of the second sub-pixel 124' in a row extension direction is a second preset value. The first preset value is smaller than the second preset value. In the pixel unit 12', the geometric center P1' of the first sub-pixel 122' and the geometric center P2' of the second sub-pixel 124' have a second connection line P1'P2', and a farthest distance between two straight lines passing through the first sub-pixel 122' and the second sub-pixel 124' but not through a third sub-pixel 126' along a direction parallel to the second connection line P1'P2' is a third distance D3'. In the pixel unit 12', the geometric center P1' of the first sub-pixel 122' and a geometric center P3'(P4') of a third sub-pixel 126' have a third connection line P1 'P3' (P1 'P4'), and a farthest distance between two straight lines passing through the first sub-pixel 122' and the third sub-pixel 126' but not through the second sub-pixel 124' along a direction parallel to the third connection line P1'P3'(P1'P4') is a fourth distance D4'. A ratio of the third distance D3' to the fourth distance D4' is less than 1.5.

In the display panel 10' of the implementation of the present application, a first sub-pixel 122' and a second sub-pixel 124' adjacent to the first sub-pixel 122' and two third sub-pixels 126' adjacent to the first sub-pixel 122' and the second sub-pixel 124' constitute an independent pixel unit 12', so that sub-pixels are uniformly distributed. A display effect is ensured through distribution of the sub-pixels in the pixel unit 12' and designs of the first distance D1' and the second distance D2'. Moreover, size coordination among various sub-pixels makes a ratio of a distance between the geometric center P1' of the first sub-pixel 122' and the first connection line P3'P4' to a distance between the geometric center P2' of the second sub-pixel 124' and the first connection line P3'P4' meet a preset condition, so that the pixel unit 12' is flat, and the geometric center P1' of the first sub-pixel 122' is closer to a geometric center of the pixel unit 12', which can reduce a sense of jagging in the display effect.

Specifically, a sub-pixel is adjacent to a sub-pixel, which means that a connection line with a minimum distance between two sub-pixels does not pass through other sub-pixels. Sizes of the first distance D1' and the second distance D2' may be determined according to shapes and sizes of the first sub-pixel 122' and the second sub-pixel 124' and relative positions of the first sub-pixel 122', the second sub-pixel 124', and the third sub-pixel 126', and the like, which is not specifically limited here. In other implementations, the design for distances between centers of various sub-pixels within a pixel unit 12 may also be applied in a design for a geometric center of a light emitting region of the pixel unit.

It should be noted that a pixel unit 12 refers to a minimum repetitive unit, that may be used for achieving a same light emitting effect and function, in the display panel 10, and multiple pixel units 12 being arranged in an array indicates that centers of the multiple pixel units 12 are crossed along at least two directions to form an array. Particularly, multiple pixel units 12' may be interleaved along two directions perpendicular to each other to be arranged in an array. In this case, the two directions perpendicular to each other may be a row extension direction and a column extension direction of pixel units 12', respectively, pixel units 12' arranged along the row extension direction form pixel rows, and pixel units 12' arranged along the column extension direction form pixel columns. Herein, rows and columns of pixel units 12' arranged in the display panel 10' are relative. Pixel units 12' arranged in a row in this implementation may be pixel units 12' arranged in a column in another implementation, and details will not be described here.

In some implementations, the first distance D1' and the second distance D2' may not be equal. In this way, a display effect is ensured through distribution of sub-pixels in the pixel unit 12' and designs of the first distance D1' and the second distance D2'.

Of course, in some other implementations, the first distance D1' and the second distance D2' may be equal, which is not specifically limited here.

As shown in FIG. 7, in some implementations, first sub-pixels 122' and second sub-pixels 124' of multiple pixel units 12' are respectively arranged sequentially in row extension directions to form multiple rows of first sub-pixels 122' and multiple rows of second sub-pixels 124', and the first sub-pixels 122' and the second sub-pixels 124' of the multiple pixel units 12' are alternately arranged in column extension directions. In this way, in the display panel 10', multiple first sub-pixel rows and second sub-pixel rows alternately arranged in column directions are formed, and correspondingly, third sub-pixels 126' forms multiple third sub-pixel rows.

Further, in some implementations, geometric centers P1' of first sub-pixels 122' and geometric centers P2' of second sub-pixels 124' alternately arranged in column extension directions may be on a same straight line. Geometric centers P1' of first sub-pixels 122' and geometric centers P2' of second sub-pixels 124' alternately arranged in row extension directions may be on a same straight line.

Of course, in some other embodiments, geometric centers P1' of first sub-pixels 122' and geometric centers P2' of second sub-pixels 124' alternately arranged in column extension directions may not be on a same straight line.

Figure 11:
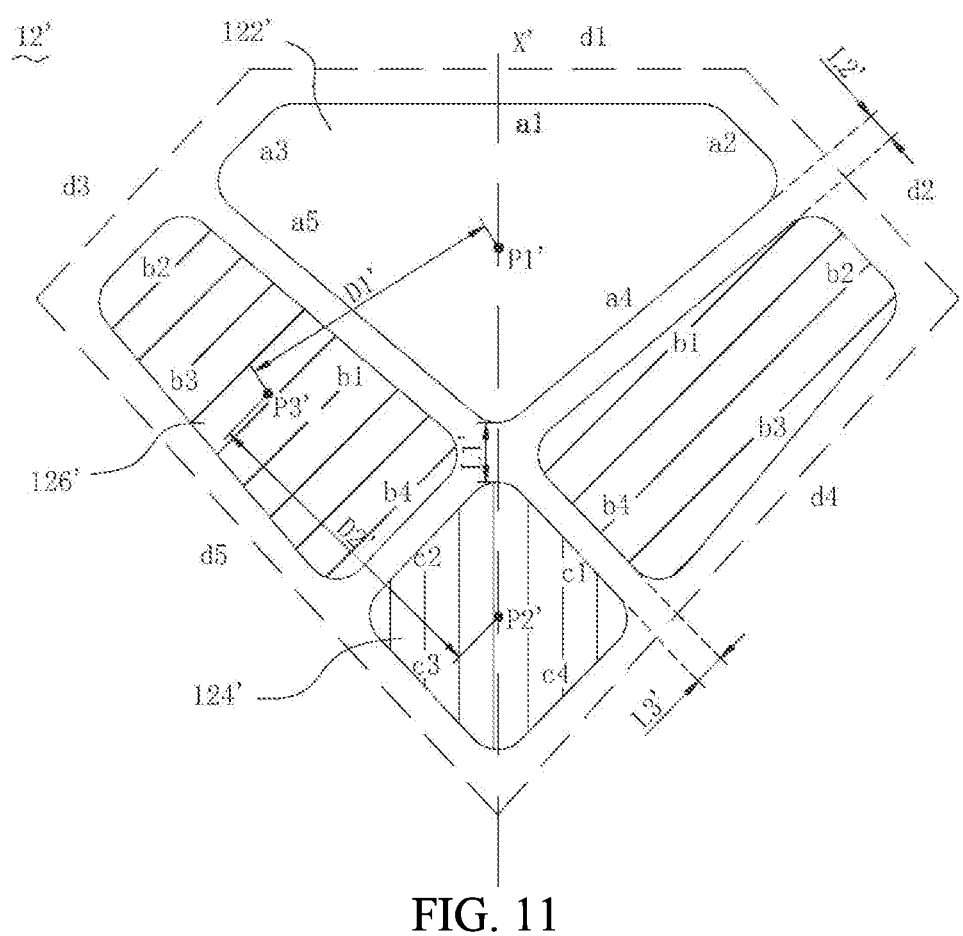
FIG. 11 is a schematic diagram of another structure of a pixel unit according to an implementation of the present application.

In the implementation of FIG. 11, pixel units 12' are arranged in a rectangular lattice, and within the display panel 10', virtual polygons in which various pixel units 12' are located do not intersect with each other, and arrangement orders of first sub-pixels 122' and second sub-pixels 124' in the pixel units 12' along column extension directions are the same. For example, first sub-pixels 122' and second sub-pixels 124' in the pixel units 12' are both arranged from top to bottom along column extension directions.

Figure 9:
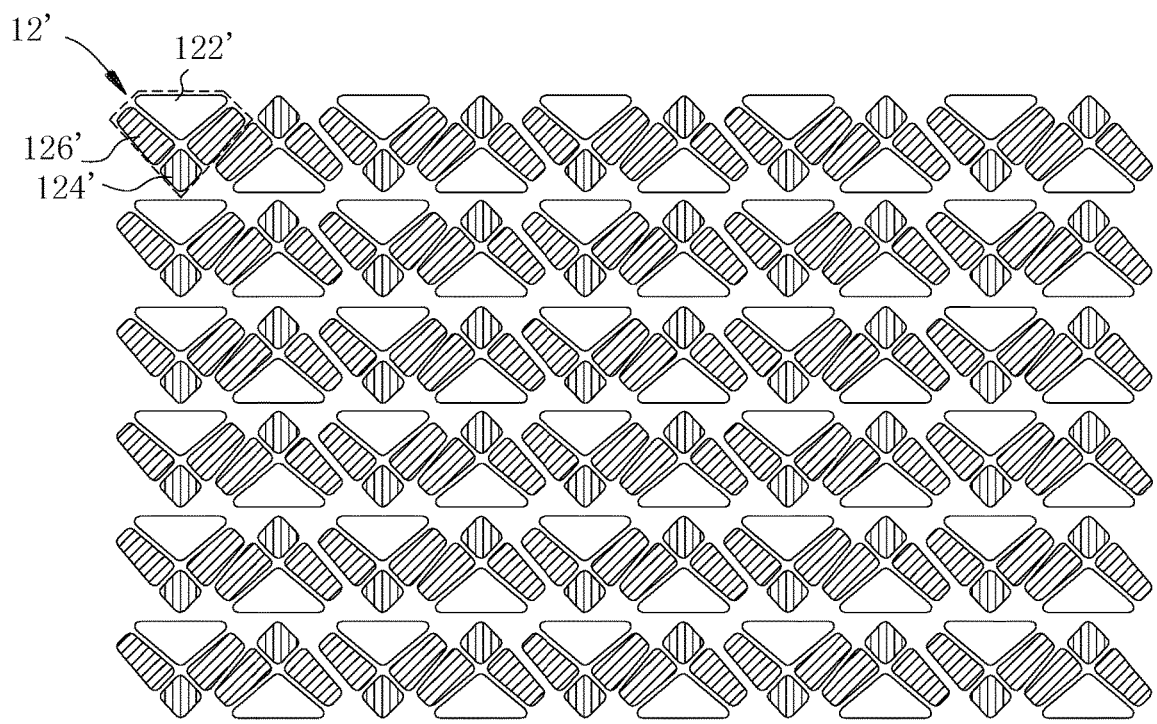
FIG. 9 is a schematic diagram of another pixel arrangement structure of a display panel according to an implementation of the present application.
Figure 10:
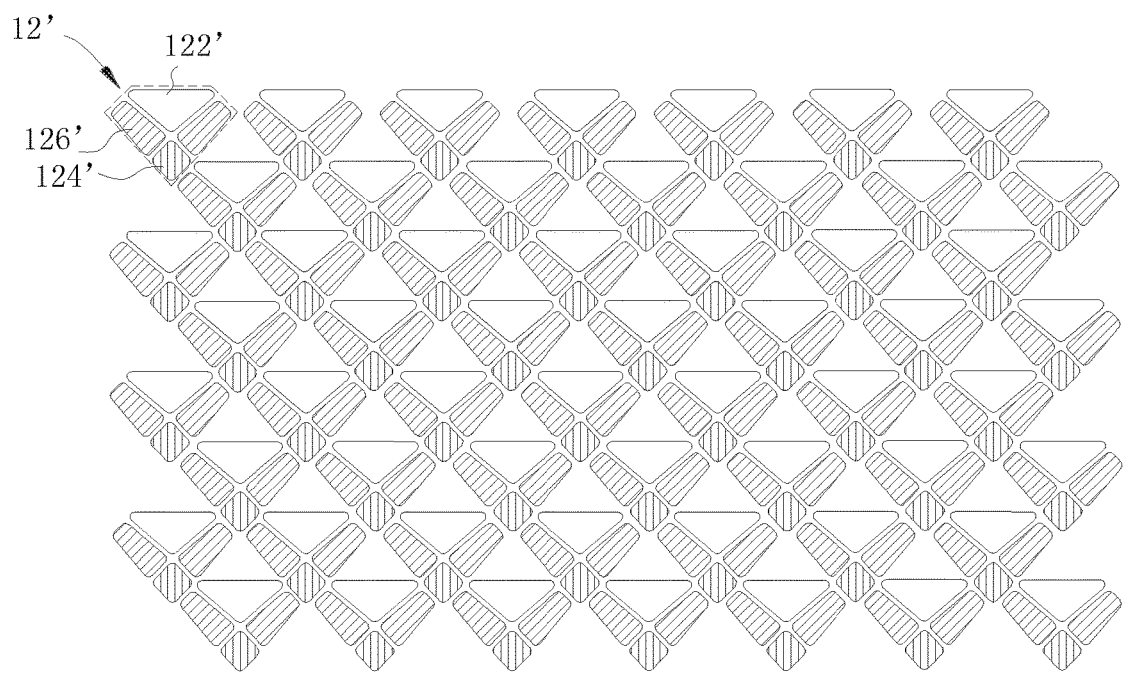
FIG. 10 is a schematic diagram of another pixel arrangement structure of a display panel according to an implementation of the present application.

Referring to FIGS. 9 and 10, in some implementations, first sub-pixels 122' and second sub-pixels 124' of multiple pixel units 12' are alternately arranged in row extension directions, and the first sub-pixels 122' and the second sub-pixels 124' of the multiple pixel units 12' are alternately arranged in column extension directions.

Accordingly, in some embodiments, geometric centers P1' of first sub-pixels 122' and geometric centers P2' of second sub-pixels 124' alternately arranged in column extension directions may be on a same straight line. Geometric centers P1' of first sub-pixels 122' and geometric centers P2' of second sub-pixels 124' alternately arranged in row extension directions may not be on a same straight line.

In an embodiment shown in FIG. 9, third sub-pixels 126' of corresponding adjacent pixel units 12' in two adjacent columns of pixel units 12' are disposed along row extension directions, in this case, pixel units 12' are arranged in a rectangular lattice, and within the display panel 10', virtual polygons in which various pixel units 12' are located do not intersect with each other. Arrangement orders of first sub-pixels 122' and second sub-pixels 124' of pixel units 12' in a same row in two adjacent columns of pixel units 12' are reverse along column extension directions. For example, in two adjacent columns of pixel units 12', a first sub-pixel 122' and a second sub-pixel 124' of one pixel unit 12' in a same row are arranged from top to bottom along a column extension direction, and a first sub-pixel 122' and a second sub-pixel 124' of the other pixel unit 12' are arranged from bottom to top along a column extension direction, so that first sub-pixels 122' in pixel units 12' of a current row and second sub-pixels 124' in pixel units 12' of the current row are alternately arranged along a row extension direction.

In an embodiment shown in FIG. 10, third sub-pixels 126' of corresponding adjacent pixel units 12' in two adjacent columns of pixel units 12' are disposed along column extension directions, in this case, pixel units 12' are arranged in a triangular lattice, and within the display panel 10', virtual polygons in which various pixel units 12' are located do not intersect with each other. First sub-pixels 122' and second sub-pixels 124' in the pixel units 12' are arranged in a same order along column extension directions. For example, first sub-pixels 122' and second sub-pixels 124' in the pixel units 12' are arranged from top to bottom along column extension directions, so that first sub-pixels 122' in pixel units 12' of a current row and second sub-pixels 124' in pixel units 12' of an adjacent row are alternately arranged along a row direction.

Of course, in some other embodiments, geometric centers P1' of first sub-pixels 122' and geometric centers P2' of second sub-pixels 124' alternately arranged in column extension directions may not be on a same straight line. Geometric centers P1' of first sub-pixels 122' and geometric centers P2' of second sub-pixels 124' alternately arranged in row extension directions may be on a same straight line.

It may be understood that specific arrangement modes of first sub-pixels 122' and second sub-pixels 124' may be determined according to sizes and an arrangement mode of pixel units 12' and sizes and positions of the first sub-pixels 122' and the second sub-pixels 124', which is not specifically limited here.

In some implementations, virtual polygons in which various pixel units 12' are located within the display panel 10' do not intersect with each other.

Referring again to FIG. 8, in some implementations, in a pixel unit 12', a spacing L2' between a first sub-pixel 122' and a third sub-pixel 126' and a spacing L3 between a second sub-pixel 124' and the third sub-pixel 126' may be equal.

Specifically, a spacing L2 between a first sub-pixel 122' and its adjacent third sub-pixel 126' needs to be greater than or equal to a process limit distance, and a spacing L3 between a second sub-pixel 124' and its adjacent third sub-pixel 126' needs to be greater than or equal to the process limit distance, to meet process requirements. Moreover, the spacing L between sub-pixels is generally the process limit distance. In this way, in the display panel 10', a spacing between sub-pixels can be reduced as much as possible. Therefore, under a condition of a same resolution, a pixel opening area can be increased at a position where a first sub-pixel 122' is adjacent to a third sub-pixel 126' and a position where a second sub-pixel 124' is adjacent to a third sub-pixel 126', a drive current of a display device can be reduced, and further life of the display device can be prolonged.

Of course, in some other implementations, in a pixel unit 12', a spacing L2' between a first sub-pixel 122' and a third sub-pixel 126' and a spacing L3 between a second sub-pixel 124' and the third sub-pixel 126' may not be equal, and may be flexibly configured according to actual needs, which is not specifically limited here.

In some implementations, in a pixel unit 12', a spacing L1' between a first sub-pixel 122' and a second sub-pixel 124' is greater than a spacing L2' between the first sub-pixel 122' and a third sub-pixel 126', and/or a spacing L1' between a first sub-pixel 122' and a second sub-pixel 124' is greater than a spacing L3' between the second sub-pixel 124' and a third sub-pixel 126'.

Specifically, the spacing L2' between the first sub-pixel 122' and an adjacent second sub-pixel 126' needs to be greater than or equal to a process limit distance.

Referring to FIG. 8 and FIGS. 11 to 21, in some implementations, a shape of a first sub-pixel 122' includes a triangle, a quadrilateral, a pentagon, a sector, or an irregular pattern, etc., a shape of a second sub-pixel 124' includes a quadrilateral, a pentagon, a sector, or an irregular pattern, etc., and a shape of a third sub-pixel 126' includes a quadrilateral or an irregular pattern, etc.

In some implementations, a shape of a pixel unit 12' is designed as axis symmetry.

For example, in an implementation shown in FIG. 8, a shape of a pixel unit 12' may be symmetrically arranged with respect to a straight line X' parallel to a column extension direction and passing through a geometric center of the pixel unit 12'.

Figure 15:
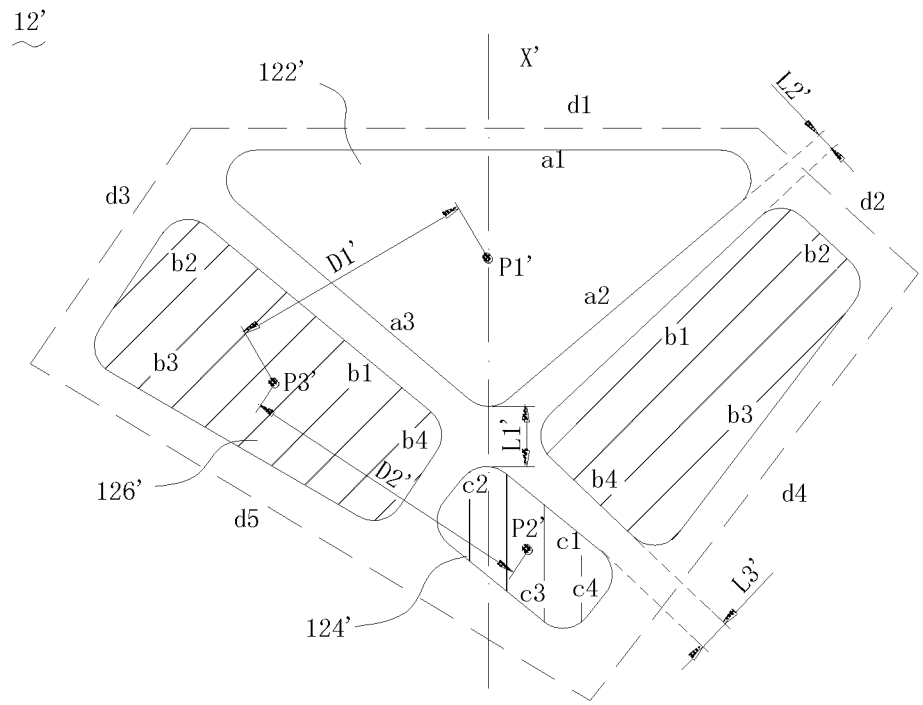
FIG. 15 is a schematic diagram of another structure of a pixel unit according to an implementation of the present application.

Of course, in some other implementations, as shown in FIG. 15, a shape of a pixel unit 122' is not designed as axis symmetry.

In some implementations, two third sub-pixels 126' in a pixel unit 12' are designed to be symmetrical with respect to a straight line where a geometric center P1' of a first sub-pixel 122' and a geometric center P2' of a second sub-pixel 124' are located.

Herein, a straight line where a geometric center P1' of a first sub-pixel 122 and a geometric center P2' of a second sub-pixel 124' are located may be designed along a column extension direction, and in this case, a symmetrical axis of two third sub-pixels 126' may be the same as a symmetrical axis of a pixel unit 12' when a shape of the pixel unit 12' is designed as axis symmetry.

In some implementations, two third sub-pixels 126' in the pixel unit 12' are of a same shape and size. Thus, light emitting effects of the two third sub-pixels 126' in the pixel unit 12' are the same, which is beneficial to achieving uniform display of the display panel 10'.

In some implementations, a shape of a first sub-pixel 122' is designed as axis symmetry.

Specifically, the first sub-pixel 122' may be symmetrically arranged with respect to a straight line parallel to a column extension direction and passing through a geometric center P1' of the first sub-pixel 122'. In a case where a shape of a pixel unit 12' is designed as axis symmetry, a symmetrical axis of the first sub-pixel 122' may be the same as a symmetrical axis of the pixel unit 12'.

In some implementations, a shape of a second sub-pixel 124' is designed as axis symmetry.

Specifically, the second sub-pixel 124' may be symmetrically arranged with respect to a straight line parallel to a column extension direction and passing through a geometric center of the second sub-pixel 124'. In a case where a shape of a pixel unit 12' is designed as axis symmetry, a symmetrical axis of the second sub-pixel 124' may be the same as a symmetrical axis of the pixel unit 12'.

Of course, the symmetrical axis of the second sub-pixel 124' may not be limited to the implementations discussed above, and may be changed according to an actual situation, which is not specifically limited here.

In some implementations, a first sub-pixel 122' in a pixel unit 12 includes a side adjacent to a third sub-pixel 126', and a side of the first sub-pixel 122' disposed opposite to a virtual polygon forms an included angle with an extension direction of an adjacent third sub-pixel 122', and an angle range of the included angle is greater than or equal to 0° and less than or equal to 30°.

Herein, the first sub-pixel 122' is opposite to a side adjacent to the third sub-pixel 126', and the extension direction of the third sub-pixel 126' may be a direction of a straight line where a connection line of midpoints of two opposite sides adjacent to a side of the third sub-pixel 126' disposed opposite to the first sub-pixel 122'. For example, a side of a third sub-pixel 126' opposite to a first sub-pixel 122' is b1, two adjacent opposite sides are a second side b2 and a fourth side b4, and a direction of a straight line where a connection line of a midpoint of the second side b2 and a midpoint of the fourth side b4 is located is an extension direction of the third sub-pixel 126'.

In some implementations, in a pixel unit 12', a size of a side of a first sub-pixel 122' close to a second sub-pixel 124' in a row extension direction is smaller than a size of a side of the first sub-pixel 122' away from the second sub-pixel 124' in the row extension direction.

Further, in some implementations, in the pixel unit 12', the size of the side of the first sub-pixel 122' close to the second sub-pixel 124' in the row extension direction is smaller than a maximum size of the first sub-pixel 122' in the row extension direction.

In this way, a size of a first sub-pixel 122' is designed in an embedded manner to be opposite to a second sub-pixel 124' in a pixel unit 12', so that cooperation among various sub-pixels is closer, and a geometric center P1' of the first sub-pixel 122' is closer to a geometric center of the pixel unit 12', thereby a sense of jagging can be reduced in a display effect.

In some implementations, a connection line of a geometric center P3' of one third sub-pixel 126' and a geometric center P2' of a second sub-pixel 124', and a connection line of the geometric center P2' of the second sub-pixel 124' and a geometric center P4' of another third sub-pixel 126' within a pixel unit 12', form a first angle, and the first angle ranges from 60° to 150°.

Further, in some implementations, a connection line of a geometric center P3' of one third sub-pixel 126' and a geometric center P1' of a first sub-pixel 122', and a connection line of the geometric center of the first sub-pixel 122' and a geometric center P4' of the other third sub-pixel 126' within a pixel unit 12, form a second angle, and the second angle is greater than the first angle.

Herein, the connection line of the geometric center P3' of one third sub-pixel 126' and the geometric center P2' of the second sub-pixel 124' is P3'P2', and the connection line of the geometric center P2' of the second sub-pixel 124' and the geometric center P4' of the other third sub-pixel 126' is P2'P4', and the first angle is a size of ∠P3'P2'P4', that is, 60°<P3'P2'P4'<150°. And the connection line of the geometric center P3' of one third sub-pixel 126' and the geometric center P1' of the first sub-pixel 122' is P3'P1', the connection line of the geometric center P1' of the first sub-pixel 122' and the geometric center P4' of the other third sub-pixel 126' is P1'P4', and the second angle is a size of ∠P3'P1'P4', that is to say ∠ P3'P1'P4' is smaller than ∠P3'P2'P4'.

In some implementations, a first sub-pixel 122', a second sub-pixel 124', and two third sub-pixels 126' in a pixel unit 12' each include an internal angle, the internal angles are adjacent, and a sum of mutually adjacent internal angles of the first sub-pixel 122', the second sub-pixel 124', and the two third sub-pixels 126' ranges from 300° to 400°.

Figure 18:
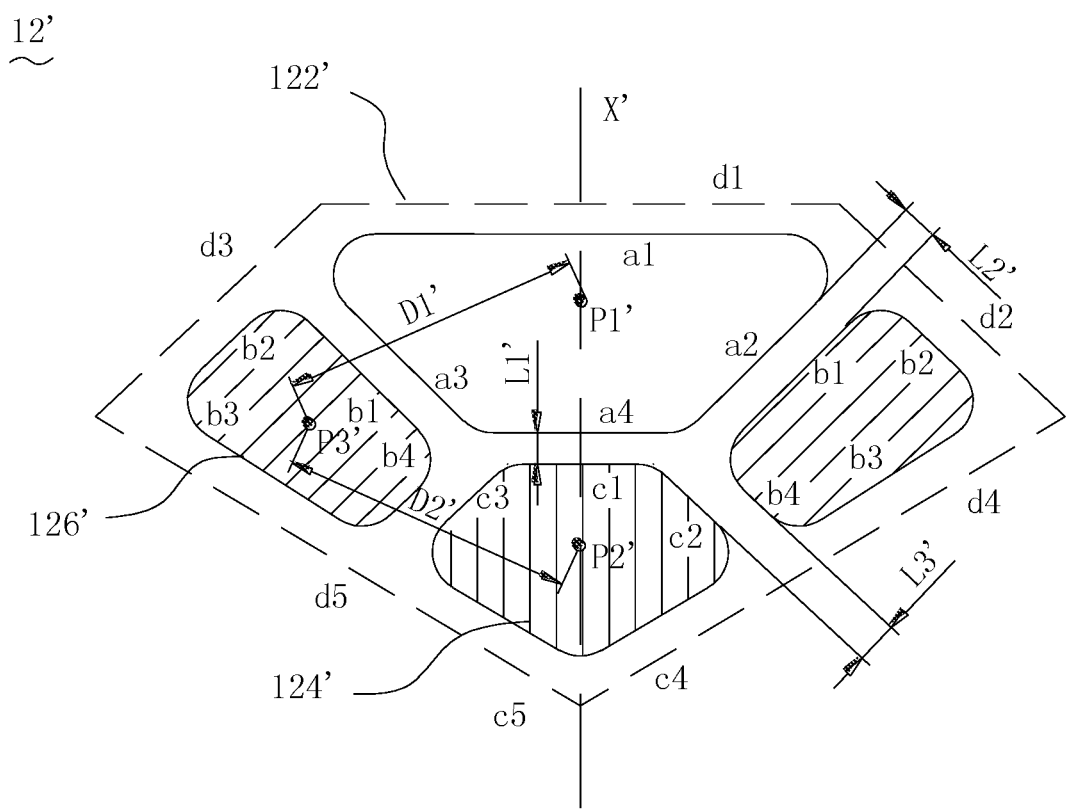
FIG. 18 is a schematic diagram of another structure of a pixel unit according to an implementation of the present application.
Figure 19:
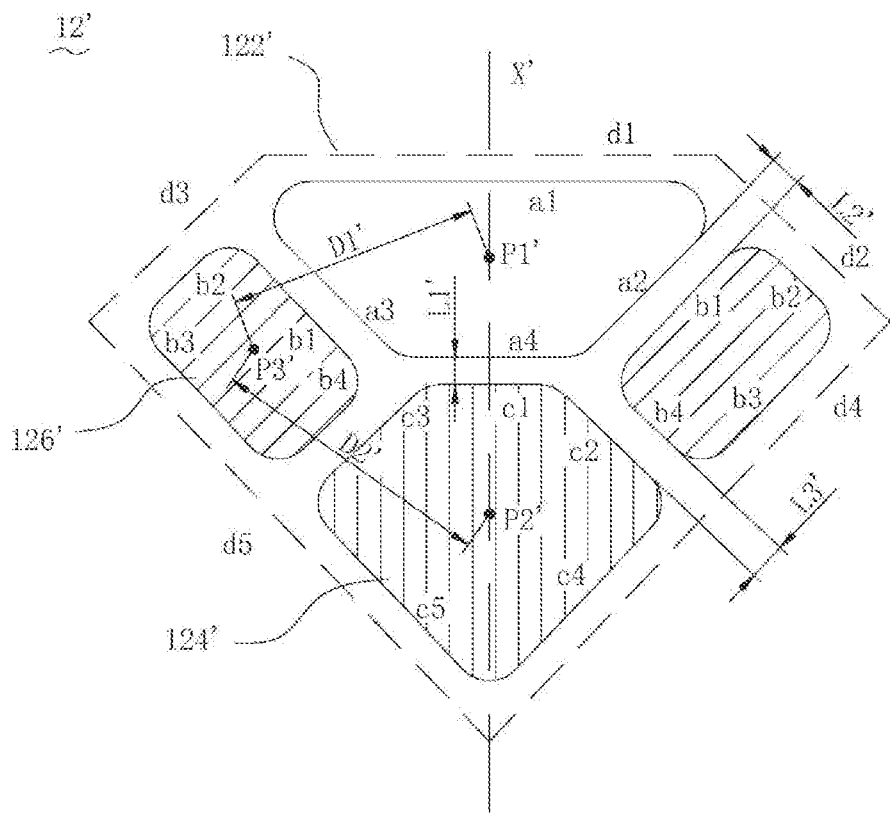
FIG. 19 is a schematic diagram of another structure of a pixel unit according to an implementation of the present application.
Figure 20:
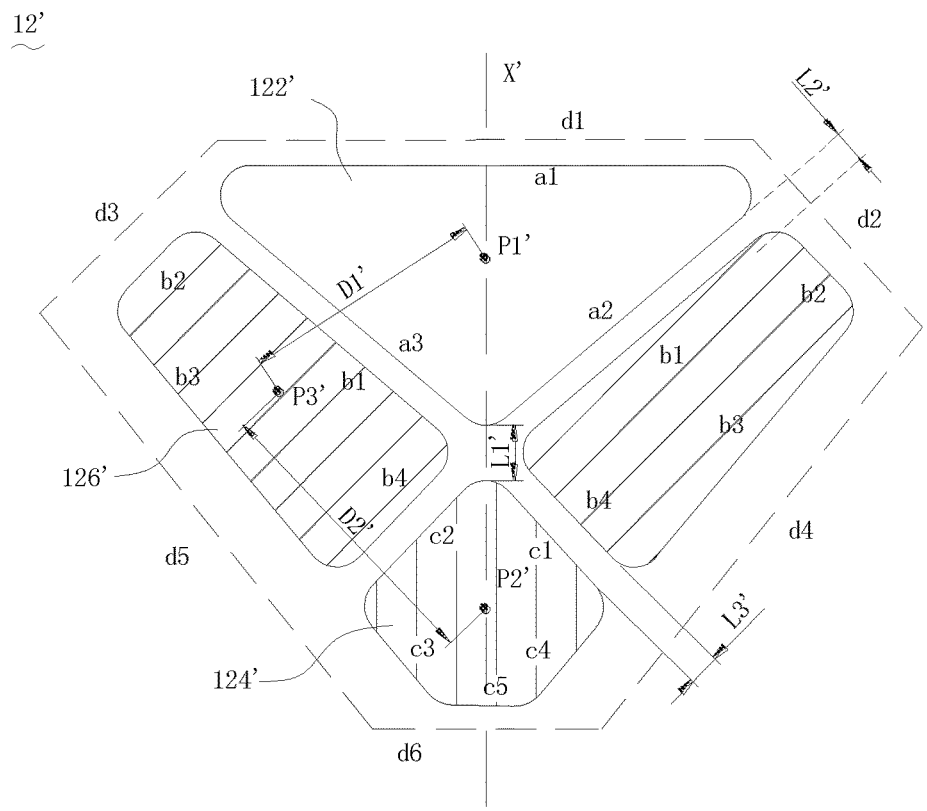
FIG. 20 is a schematic diagram of another structure of a pixel unit according to an implementation of the present application.
Figure 21:
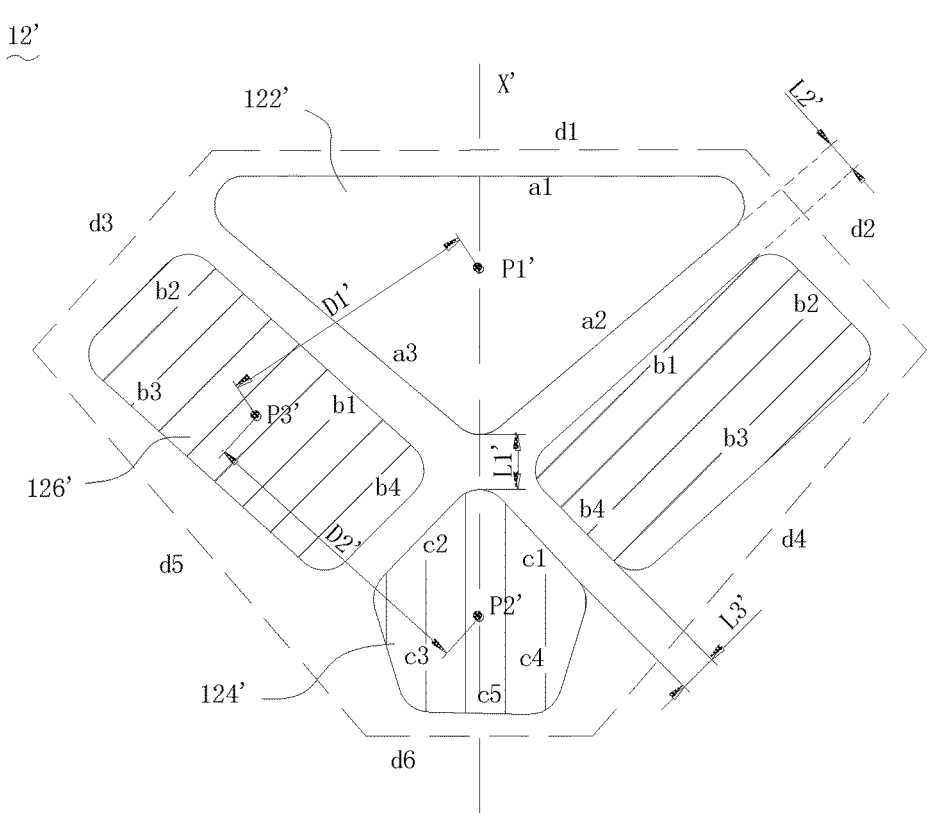
FIG. 21 is a schematic diagram of another structure of a pixel unit according to an implementation of the present application.
Figure 22:
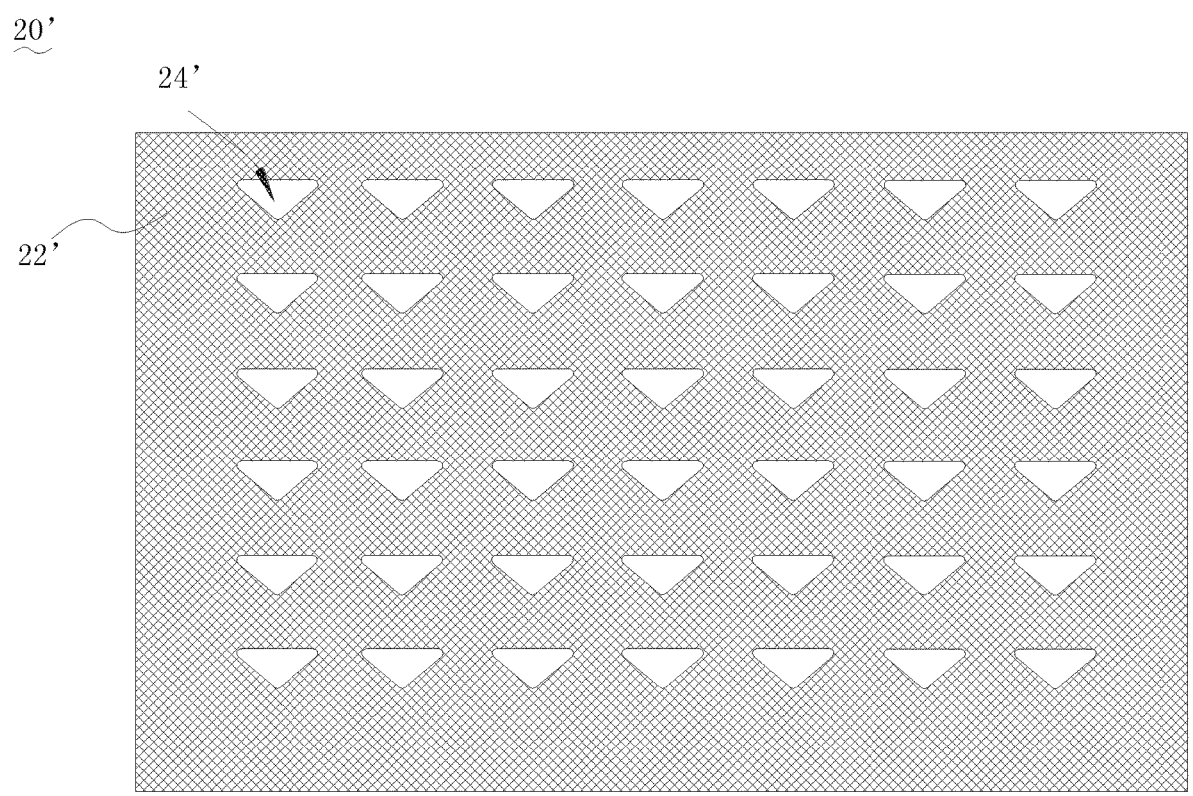
FIG. 22 is a schematic diagram of another structure of a first mask according to an implementation of the present application.
Figure 23:
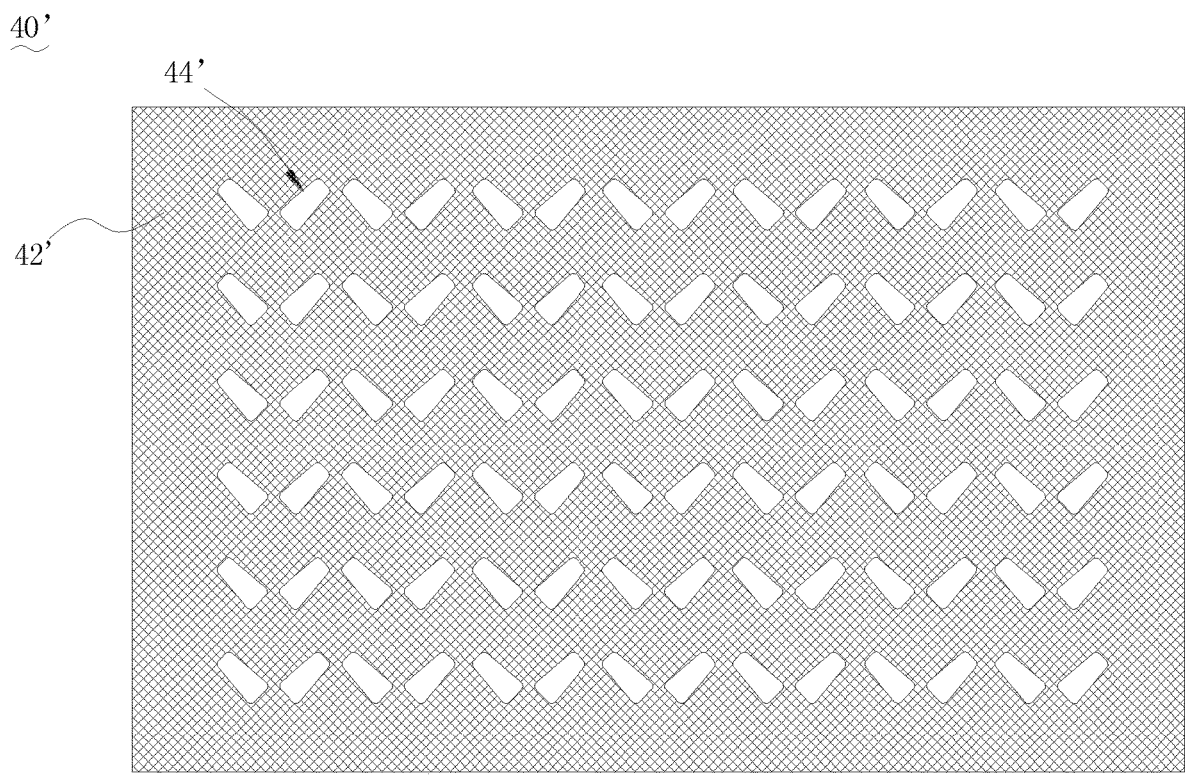
FIG. 23 is a schematic diagram of another structure of a second mask according to an implementation of the present application.
Figure 24:
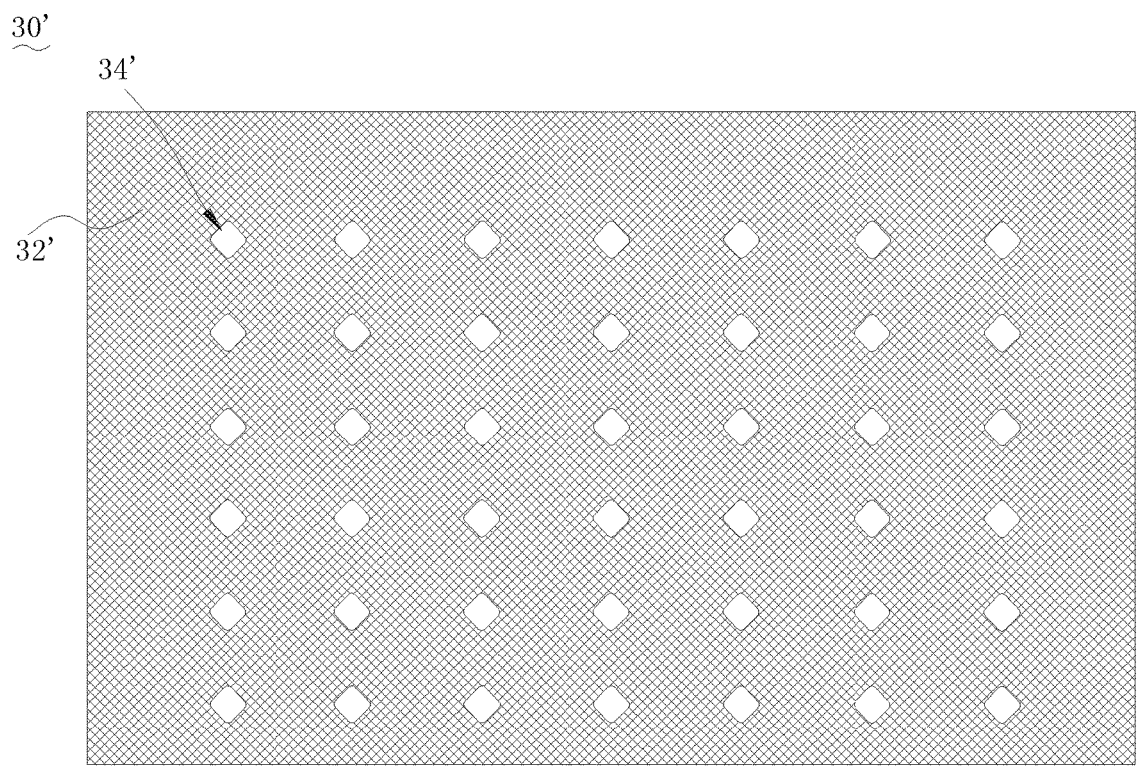
FIG. 24 is a schematic diagram of another structure of a third mask according to an implementation of the present application.

It should be noted that, the first sub-pixel 122', the second sub-pixel 124', and the two third sub-pixels 126' may not be limited to each including only one adjacent internal angle. As shown in FIGS. 18 and 19, a first sub-pixel 122' and a second sub-pixel 124' may each include two internal angles adjacent to a third sub-pixel 126', in this way, a range of a sum of mutually adjacent internal angles of the first sub-pixel 122', the second sub-pixel 124', and the two third sub-pixels 126' may not be limited to the implementations discussed above, but may be flexibly configured according to actual needs, which is not specifically limited here.

In some implementations, in a pixel unit 12', a projection of a first sub-pixel 122' along a row extension direction is overlapped with a projection of a third sub-pixel 126' along a row extension direction. A portion in which the projection of the first sub-pixel 122' along the row extension direction is overlapped with the projection of the third sub-pixel 126' along the row extension direction is larger than a portion in which the projection of the first sub-pixel 122' along the row extension direction is not overlapped with the projection of the third sub-pixel 126' along the row extension direction.

In this way, a geometric center P1' of the first sub-pixel 122' is closer to a geometric center of the pixel unit 12', thereby a sense of jagging can be reduced in a display effect.

Referring to FIG. 11, in some implementations, a virtual polygon is a virtual pentagon, a first side a1 of a first sub-pixel 122' is disposed along a first side d1 of the virtual pentagon, s second side a2 and a third side a3 of the first sub-pixel 122' are disposed along a second side d2 and a third side d3 of the virtual pentagon, respectively, a fourth side a4 and a fifth side a5 of the first sub-pixel 122' are respectively disposed opposite to first sides b1 of two opposite third sub-pixels 126', second sides b2 of the two third sub-pixels 126' are disposed along a second side d2 and a third side d3 of the virtual pentagon, respectively, third sides b3 of the two third sub-pixels 126' are disposed along a fourth side d4 and a fifth side d5 of the virtual pentagon, respectively, and fourth sides b4 of the two third sub-pixels 126' are disposed opposite to a second sub-pixel 124'.

Specifically, the first sub-pixel 122' may be substantially pentagonal and a third sub-pixel 126' may be substantially quadrilateral, and thereby the first sub-pixel 122' and the third sub-pixel 126' may cooperate with each other and are compactly arranged within the virtual pentagonal to ensure a display effect.

Figure 12:
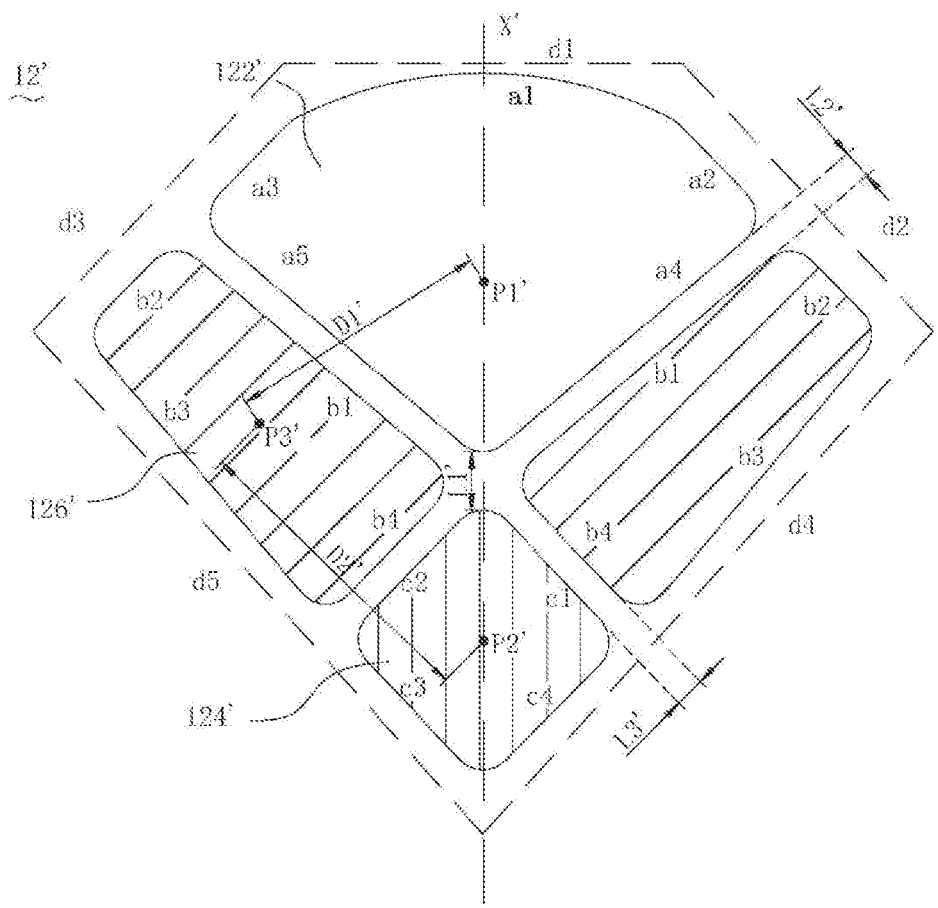
FIG. 12 is a schematic diagram of another structure of a pixel unit according to an implementation of the present application.

Referring to FIG. 12, in some implementations, a virtual polygon is a virtual pentagon, a first sub-pixel 122' includes an arc-shaped first side a1, the first side a1 of the first sub-pixel 122' is disposed opposite to a first side d1 of the virtual pentagon, a second side a2 and a third side a3 of the first sub-pixel 122' are disposed along a second side d2 and a third side d3 of the virtual pentagon, respectively, a fourth side a4 and a fifth side a5 of the first sub-pixel 122' are respectively disposed opposite to first sides b1 of two opposite third sub-pixels 126', second sides b2 of the two third sub-pixels 126' are disposed along a second side d2 and a third side d3 of the virtual pentagon, respectively, third sides b3 of the two third sub-pixels 126' are disposed along a fourth side d4 and a fifth side d5 of the virtual pentagon, respectively, and fourth sides b4 of the two third sub-pixels 126' are disposed opposite to a second sub-pixel 124'.

Specifically, the first sub-pixel 122' may be substantially in a shape of a quadrilateral with rounded corners arranged opposite to the first side d1 of the virtual pentagon, and a third sub-pixel 126' may be substantially quadrilateral, and thereby the first sub-pixel 122' and the third sub-pixel 126' may cooperate with each other and are compactly arranged within the virtual pentagonal to ensure a display effect.

Figure 13:
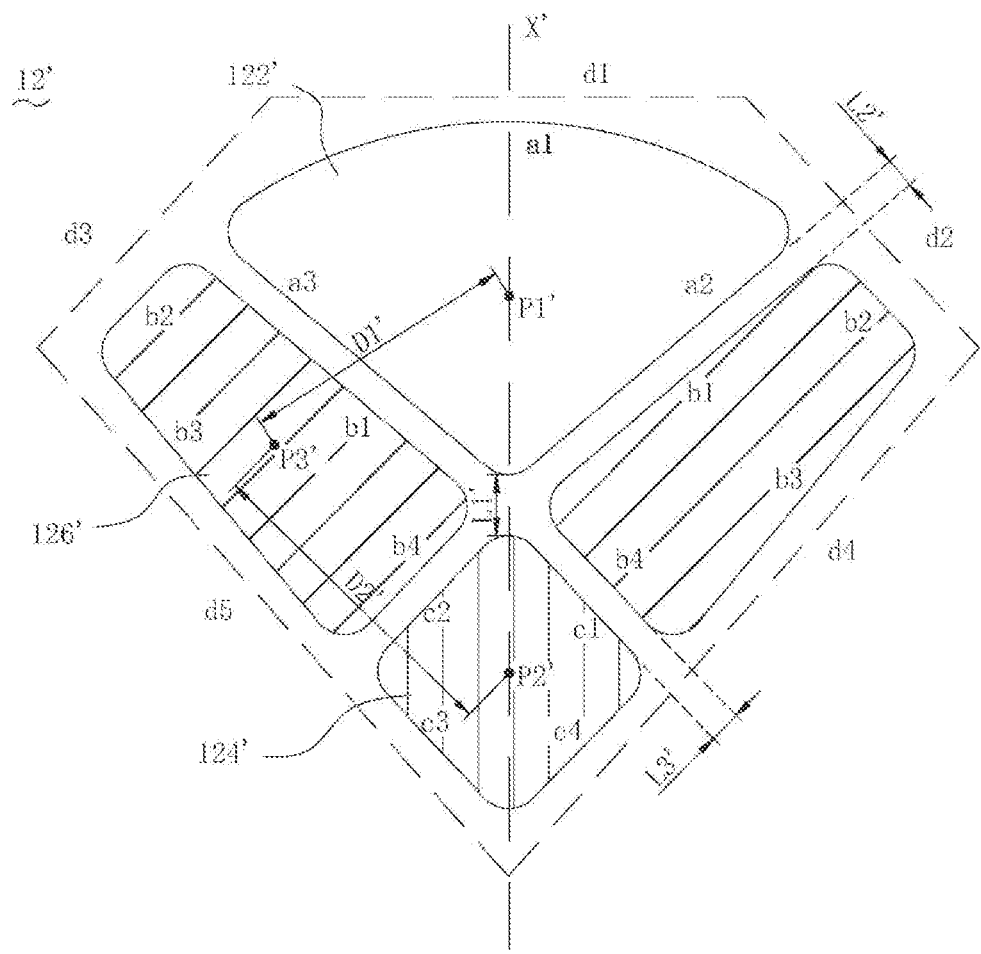
FIG. 13 is a schematic diagram of another structure of a pixel unit according to an implementation of the present application.

Referring to FIG. 13 in some implementations, a virtual polygon is a virtual pentagon, a first sub-pixel 122' includes an arc-shaped first side a1, the first side a1 of the first sub-pixel 122' is disposed opposite to a first side d1 of the virtual pentagon, a second side a2 and a third side a3 of the first sub-pixel 122' are disposed opposite to first sides b1 of two third sub-pixels 126' respectively, second sides b2 of the two third sub-pixels 126' are disposed along a second side d2 and a third side d3 of the virtual pentagon, respectively, third sides b3 of the two third sub-pixels 126' are disposed along a fourth side d4 and a fifth side d5 of the virtual pentagon, respectively, and fourth sides b4 of the two third sub-pixels 126' are disposed opposite to a second sub-pixel 124'.

Specifically, a first sub-pixel 122' may be substantially fan-shaped and a third sub-pixel 126' may be substantially quadrilateral, so that the first sub-pixel 122' and the third sub-pixel 126' may cooperate with each other and are compactly disposed within the virtual pentagon to ensure a display effect.

Referring to FIGS. 14 to 17, in some implementations, a virtual polygon is a virtual pentagon, a first side a1 of a first sub-pixel 122' is disposed along a first side d1 of the virtual pentagon, a second side a2 and a third side a3 of the first sub-pixel 122' are disposed opposite to first sides b1 of two third sub-pixels 126' respectively, second sides b2 of the two third sub-pixels 126' are disposed along a second side d2 and a third side d3 of the virtual pentagon, respectively, third sides b3 of the two third sub-pixels 126' are disposed along a fourth side d4 and a fifth side d5 of the virtual pentagon, respectively, and fourth sides b4 of the two third sub-pixels 126' are disposed opposite to a second sub-pixel 124'.

Specifically, the first sub-pixel 122' may be substantially triangular and a third sub-pixel 126' may be substantially quadrilateral, so that the first sub-pixel 122' and the third sub-pixel 126' may cooperate with each other and are compactly disposed within the virtual pentagonal to ensure a display effect.

In some embodiments, two third sub-pixels 126' may be disposed symmetrically with respect to a line X where a geometric center P1' of a first sub-pixel 122' and a geometric center P2' of a second sub-pixel 124' are located.

Referring to FIG. 8, in some implementations, a second sub-pixel 124' may be substantially quadrilateral, a first side c1 and a second side c2, that are adjacent, of the second sub-pixel 124' are respectively disposed opposite to fourth sides b4 of two third sub-pixels 126', and a third side c3 and a fourth side c4, that are adjacent, of the second sub-pixel 124' are respectively disposed opposite to a fifth side d5 and a fourth side d4 of a virtual pentagon. That is, the second sub-pixel 124' is formed with various sides opposite to the fourth sides b4 of the two third sub-pixels 126' and corresponding to the fourth side d4 and the fifth side d5 of the virtual pentagon. Herein the third side c3 and the fourth side c4 of the second sub-pixel 124' are respectively located on extension lines of third sides b3 of the two third sub-pixels 126', and an included angle formed by the first side c1 and the second side c2 of the second sub-pixel 124' is disposed opposite to an included angle formed by a second side a2 and a third side a3 of a first sub-pixel 122'. Accordingly, the second sub-pixel 124' may cooperate with the first sub-pixel 122' and the third sub-pixel 126' and be compactly disposed in the virtual pentagon to ensure a display effect.

In some implementations, third sub-pixels 126' in a pixel unit 12' have a same size and shape. In this way, light emitting effects of third sub-pixels 126' in each pixel unit 12' are the same, which is beneficial to ensuring a display effect of a display panel 10'.

In some embodiments, lengths of a second side b2 and a fourth side b4, which are opposite, of a third sub-pixel 126' are not equal.

In some implementations, lengths of fourth sides b4 of two third sub-pixels 126' may be equal. In this case, lengths of a first side c1 and a second side c2 of a second sub-pixel 124' may be equal, and the second sub-pixel 124' may be substantially square.

Further, in some examples, in a case where lengths of fourth sides b4 of two third sub-pixels 126' are equal, lengths of corresponding second sides b2 of the two third sub-pixels 126' are equal, in this case, a length of a second side d2 and a length of a third side d3 of a virtual pentagon are the same. As shown in FIG. 8, in each third sub-pixel 126', a length of a second side b2 may be shorter than a length of a fourth side b4, or, as shown in FIG. 14, in each third sub-pixel 126', a length of a second side b2 may be longer than a length of a fourth side b4.

Figure 14:
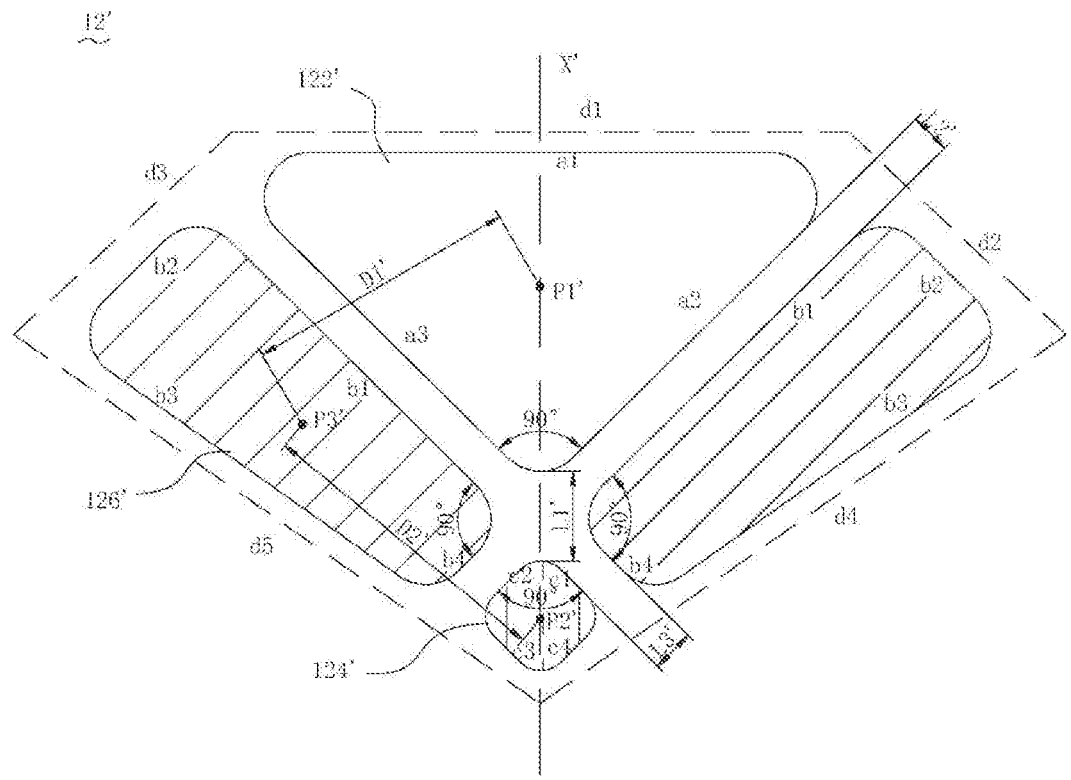
FIG. 14 is a schematic diagram of another structure of a pixel unit according to an implementation of the present application.

Referring to FIG. 14, in some implementations, an included angle between a second side a2 and a third side a3 of a first sub-pixel 122' is 90°. An included angle between a first side c1 and a second side c2 of a second sub-pixel 124' is 90°, and an included angle between a first side b1 and a fourth side b4 of a third sub-pixel 126' is 90°.

Specifically, an included angle between a second side a2 and a third side a3 of a first sub-pixel 122', an included angle between a first side c1 and a second side c2 of a second sub-pixel 124', and included angles between first sides b1 and fourth sides b4 of two third sub-pixels 126' are disposed in a surrounding manner, and four right angles are disposed in cooperation with each other, so that four sub-pixels are closely in a virtual pentagon to ensure a display effect.

In some implementations, a second side b2 and a fourth side b4 of a third sub-pixel 126' are parallel to each other. In this way, the third sub-pixel 126' may be trapezoidal. In particular, the third sub-pixel 126' may be in a shape of a right-angled trapezoid, and a first side b1 of the third sub-pixel 126' may be a right-angled waist of the right-angled trapezoid.

Referring to FIG. 15, in some other implementations, lengths of fourth sides b4 of two third sub-pixels 126' may not be equal. In this case, a second side b2 of any one of two third sub-pixels 126' of a pixel unit 12' may equal to a fourth side b4 of the other third sub-pixel 126', and accordingly, lengths of a second side d2 and a third side d3 of a virtual pentagon may be different, and a second sub-pixel 124' may be substantially rectangular.

It should be noted that in a case where the second sub-pixels 124' are substantially rectangular, geometric centers of multiple first sub-pixels 122' and geometric centers P2' of multiple second sub-pixels 124' arranged along column extension directions may not be on a same straight line.

Figure 16:
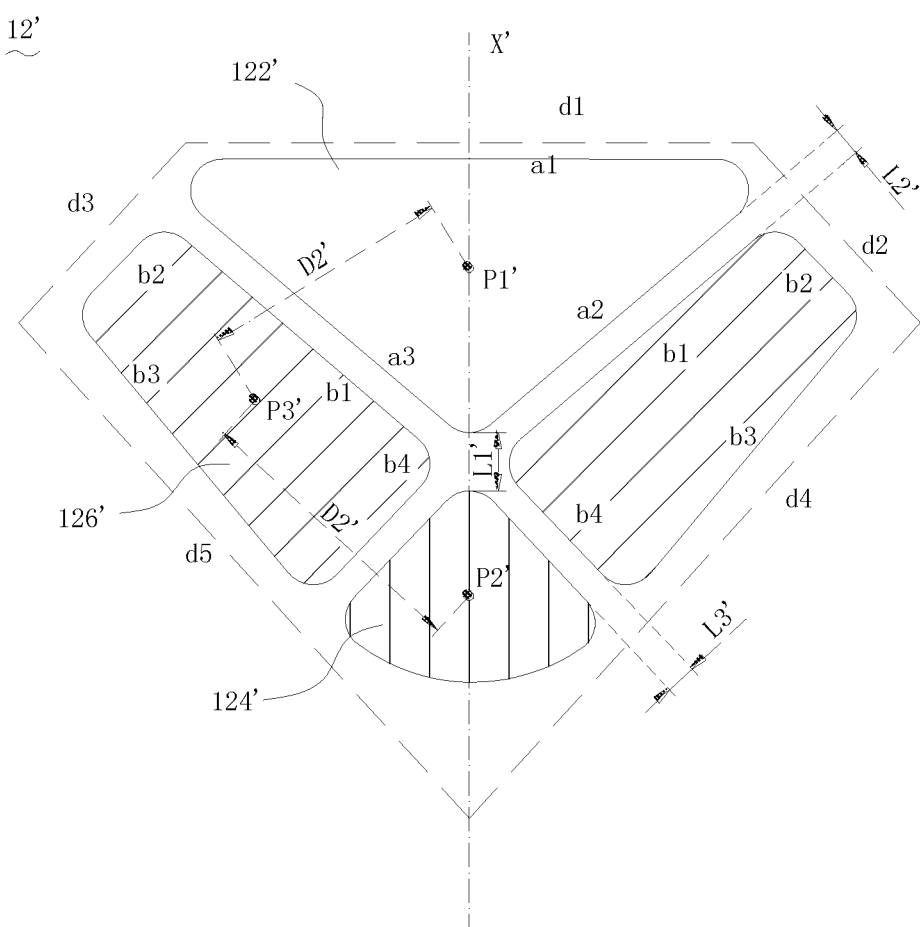
FIG. 16 is a schematic diagram of another structure of a pixel unit according to an implementation of the present application.

Referring to FIG. 16, in some implementations, a second sub-pixel 124' is substantially fan-shaped and two straight sides of the second sub-pixel 124' are disposed opposite to fourth sides b4 of two third sub-pixels 126', respectively.

Similarly, the second sub-pixel 124' is formed with straight sides that cooperate with the fourth sides b4 of the two third sub-pixels 126', an included angle formed by the two straight sides of the second sub-pixel 124' are disposed opposite to an included angle formed by a second side a2 and a third side a3 of a first sub-pixel 122', and an arc side of the second sub-pixel 124' is disposed opposite to a fourth side d4 and a fifth side d5 of a virtual pentagon. Accordingly, the second sub-pixel 124' may cooperate with the first sub-pixel 122' and the third sub-pixel 126' to be compactly disposed in the virtual pentagon to ensure a display effect.

Figure 17:
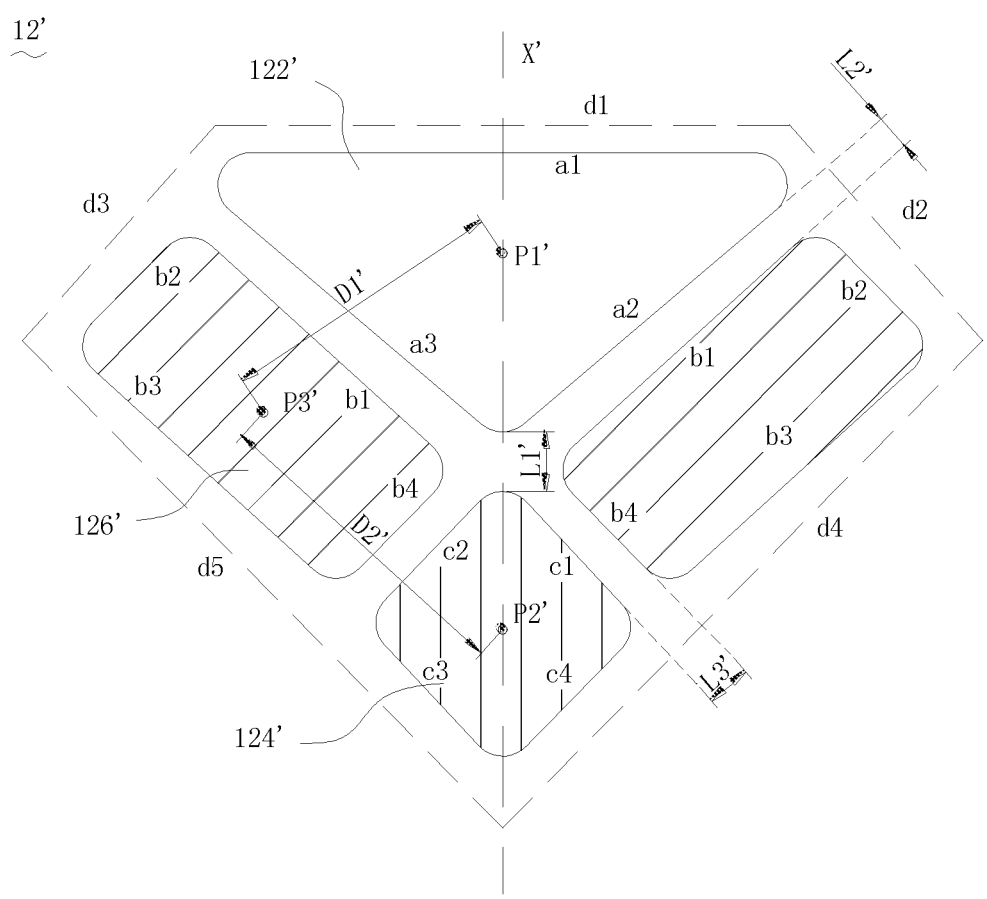
FIG. 17 is a schematic diagram of another structure of a pixel unit according to an implementation of the present application.

Referring to FIG. 17, in some implementations, lengths of a second side b2 and a fourth side b4 of each third sub-pixel 126' may also be the same.

Referring to FIGS. 18 and 19, in some implementations, one first sub-pixel 122', one second sub-pixel 124', and two third sub-pixels 126' of each pixel unit 12' are located within a virtual pentagon, a first side a1 of the first sub-pixel 122' is disposed along a first side d1 of the virtual pentagon, a second side a2 and a third side a3 of the first sub-pixel 122' are disposed opposite to first sides b1 of the two third sub-pixels 126' respectively, a fourth side a4 of the first sub-pixel 122' is disposed opposite to a first side c1 of the second sub-pixel 124', second sides b2 of the two third sub-pixels 126' are disposed along a second side d2 and a third side d3 of the virtual pentagon, respectively, third sides b3 of the two third sub-pixels 126' are disposed along a fourth side d4 and a fifth side d5 of the virtual pentagon, respectively, fourth sides b4 of the two third sub-pixels 126' are disposed opposite to a second side c2 and a third side c3 of the second sub-pixel 124', respectively, and a fourth side c4 and a fifth side c5 of the second sub-pixel 124' are disposed along the fourth side d4 and the fifth side d5 of the virtual pentagon, respectively.

In this case, the first sub-pixel 122' may be substantially quadrilateral, in particular, the first sub-pixel 122' may be substantially in a shape of a trapezoid, the first side a1 and the fourth side a4 of the first sub-pixel 122' are bottom sides of the trapezoid, and the second side a3 and the third side a4 of the first sub-pixel 122' are waists of the trapezoid. The second sub-pixel 124' may be pentagonal. The third sub-pixel 126' may be substantially quadrilateral. In an example of FIG. 18, the third sub-pixel 126' may be substantially disposed in a trapezoidal shape. In an example of FIG. 19, the third sub-pixel 126' may be substantially rectangular.

In some implementations, one first sub-pixel 122', one second sub-pixel 124', and two third sub-pixels 126' of each pixel unit 12' are located within a virtual hexagon, a first side a1 of the first sub-pixel 122' is disposed along a first side d1 of the virtual hexagon, a second side a2 and a third side a3 of the first sub-pixel 122' are disposed opposite to first sides b1 of the two third sub-pixels 126' respectively, second sides b2 of the two third sub-pixels 126' are disposed along a second side d2 and a third side d3 of the virtual hexagon, respectively, third sides b3 of the two third sub-pixels 126' are disposed along a fourth side d4 and a fifth side d5 of the virtual hexagon, respectively, fourth sides b4 of the two third sub-pixels 126' are disposed opposite to a first side c1 and a second side c2 of the second sub-pixel 124', a third side c3 and a fourth side c4 of the second sub-pixel 124' are disposed along the fourth side d4 and the fifth side d5 of the virtual hexagon, respectively, and a fifth side c5 of the second sub-pixel 124' is disposed along a sixth side d6 of the virtual hexagon.

In this case, the first sub-pixel 122' may be substantially triangular and the second sub-pixel 124' may be substantially pentagonal. The third sub-pixel 126' may be substantially quadrilateral. In an example of FIG. 20, the third sub-pixel 126' may be substantially disposed in a trapezoidal shape. In an example of FIG. 21, the third sub-pixel 126' may be substantially rectangular.

Of course, in some other implementations, a first sub-pixel 122', a second sub-pixel 124', and a third sub-pixel 126' are not limited to shapes discussed above, one or more of a quadrilateral, a hexagon, and an octagon may be selected according to actual needs, and accordingly, designs of various sides of the first sub-pixel 122', the second sub-pixel 124', and the third sub-pixel 126' and angular relationships among various sides are also flexibly configured according to needs, which are not specifically limited here. It should be noted that in a case where various sub-pixels are designed as a polygon, various sides of the polygon is not limited to a strictly straight line segment, and various sides may extend along a predetermined direction within a certain range due to a process error, which is not specifically limited here.

In some implementations, a ratio of a length of a second side b2 in a third sub-pixel 126' to a length of a fourth side b4 of the third sub-pixel 126' ranges from 0.5 to 2.

In some implementations, a connection line of a midpoint of a second side b2 and a midpoint of a fourth side b4 in a third sub-pixel 126' passes through a geometric center P3'(P4') of the third sub-pixel 126'.

In illustrated implementations, various sub-pixels may be designed with rounded corners at intersections of various sides. Of course, in some other implementations, various sub-pixels may be designed in a chamfered manner or in other ways at intersections of various sides, which is not specifically limited here.

In some implementations, a color of light emitted by a first sub-pixel 122' and a color of light emitted by a second sub-pixel 124' and a color of light emitted by a third sub-pixel 126' are different from one another.

Further, light emitted by sub-pixels in each pixel unit 12' includes red light, green light, and blue light. The display panel 10' can achieve normal display of a full-color image by uniformly distributing sub-pixels with different colors.

In some implementations, a first sub-pixel 122' emits blue light, a second sub-pixel 124' emits red light, and a third sub-pixel 126' emits green light, an area of the first sub-pixel 122' is larger than an area of the third sub-pixel 126', and the area of the third sub-pixel 126' is larger than an area of the second sub-pixel 124'.

It should be noted that in one example, an area of each sub-pixel may be an area of a pixel light emitting material, for example, an area of an anode material of an organic light emitting diode. In another example, an area of each sub-pixel may also be an area of an opening of a pixel emitting material to emit light through the opening, for example, an opening area of a pixel definition layer corresponding to a sub-pixel in an organic light emitting diode display panel 10', which is not specifically limited here.

For an organic light emitting diode display device, an area of a blue sub-pixel may be larger than that of a red sub-pixel and that of a green sub-pixel because a blue light emitting material generally has a lowest light emitting efficiency and a relatively short lifetime compared with a red light emitting material and a green light emitting material. In addition, since human eyes are more sensitive to green and a green light emitting material has a highest efficiency, an area of a green sub-pixel may be the smallest.

Of course, in some other implementations, a correspondence of light emitting colors of a first sub-pixel 122', a second sub-pixel 124', and a third sub-pixel 126' may not be limited to the implementations discussed above, and may be changed according to actual needs, for example, the first sub-pixel 122' emits red light, the second sub-pixel 124' emits blue light, and the third sub-pixel 126' emits green light, which is not specifically limited here.

In combination with FIG. 7, FIG. 8, and FIGS. 22 to 24, a mask assembly (not shown in the figures) provided by an implementation of the present application may be used for fabricating the display panel 10' of any of the above implementations. The mask assembly includes a first mask 20', a second mask 30', and a third mask 40'. The first mask 20' includes a first substrate 22' and a first opening 24' opened on the first substrate 22', and the first opening 24' corresponds to a first sub-pixel 122'. The second mask 30' includes a second substrate 32' and a second opening 34' opened on the second substrate 32', and the second opening 34' corresponds to a second sub-pixel 124'. The third mask 40' includes a third substrate 42' and a third opening 44' opened on the third substrate 42', and the third opening 44' corresponds to a third sub-pixel 126'.

A mask assembly according to an implementation of the present application may be fabricated to form a display panel 10'. Four sub-pixels in the display panel 10' together constitute an independent light emitting unit, and within a virtual pentagon, a geometric center P1' of a first sub-pixel 122' and geometric centers of two third sub-pixels 126' have a same first distance D1', a geometrical center P2' of a second sub-pixel 124' and the geometrical centers of the two third sub-pixels 126' have a same second distance D2', so that sub-pixels are uniformly distributed, and a display effect is ensured through distribution of sub-pixels in the pixel unit 12' and designs of the first distance D1' and the second distance D2'.

In some implementations, the first substrate 22', the second substrate 32', and the third substrate 42' are made of a metal material. In this way, the first mask 20', the second mask 30', and the third mask 40' may be high-precision metal masks, and may be applied to an evaporation process to form a corresponding display panel 10' by evaporating an organic light emitting material corresponding to a pixel pattern.

In this way, a combined Mask Frame Assembly may be respectively placed into a corresponding evaporation chamber to evaporate an organic light emitting material corresponding to a sub-pixel. Specifically, a pattern of a sub-pixel may be formed each time by evaporation, a pattern of another sub-pixel is formed after a pattern of one sub-pixel is formed, and patterns of three sub-pixels are formed sequentially to obtain the display panel 10' according to the implementation of the present application.

It should be noted that a first opening 24' corresponds to a first sub-pixel 122', which means that a shape, a size, and a relative position distribution of the first opening 24' corresponds to a shape, a size, and a relative position distribution of the first sub-pixel 122' in the display panel 10'. Thereby, during an evaporation process, an evaporation material may form the first sub-pixel 122' having a predetermined shape, size, and relative position distribution on an array substrate through the first opening 24', i.e., a pattern of the first sub-pixel 122'. Accordingly, a second opening 34' corresponds to a second sub-pixel 124', which means that a shape, a size, and a relative position distribution of the second opening 34' corresponds to a shape, a size, and a relative position distribution of the second sub-pixel 124' in the display panel 10', and a third opening 44' corresponds to a third sub-pixel 126', which means that a shape, a size, and a relative position distribution of the third opening 44' corresponds to a shape, a size, and a relative position distribution of the third sub-pixel 126' in the display panel 10'.

Of course, in some other implementations, it is not limited to use an evaporation process to form the display panel 10', and a photolithography process, an etching process, or the like may be used as required to form the display panel 10'.

A display apparatus according to an implementation of the present application includes the display panel 10' according to any of the above implementations.

In a display apparatus of an implementation of that present application, any one first sub-pixel 122' and a second sub-pixel 124' adjacent to the first sub-pixel 122' and two third sub-pixels 126' adjacent to the first sub-pixel 122' and the second sub-pixel 124' in the display panel 10' constitute an independent pixel unit 12', so that sub-pixels are uniformly distributed, and a display effect is ensured through distribution of the sub-pixels in the pixel unit 12' and designs of the first distance D1' and the second distance D2'. Moreover, size coordination among various sub-pixels makes a ratio of a distance between the geometric center P1' of the first sub-pixel 122' and the first connection line P3'P4' to a distance between the geometric center P2' of the second sub-pixel 124' and the first connection line P3'P4' meet a preset condition, so that the pixel unit 12' is flat, and the geometric center P1' of the first sub-pixel 122' is closer to a geometric center of the pixel unit 12', which can reduce a sense of jagging in a display effect.

Figure 25:
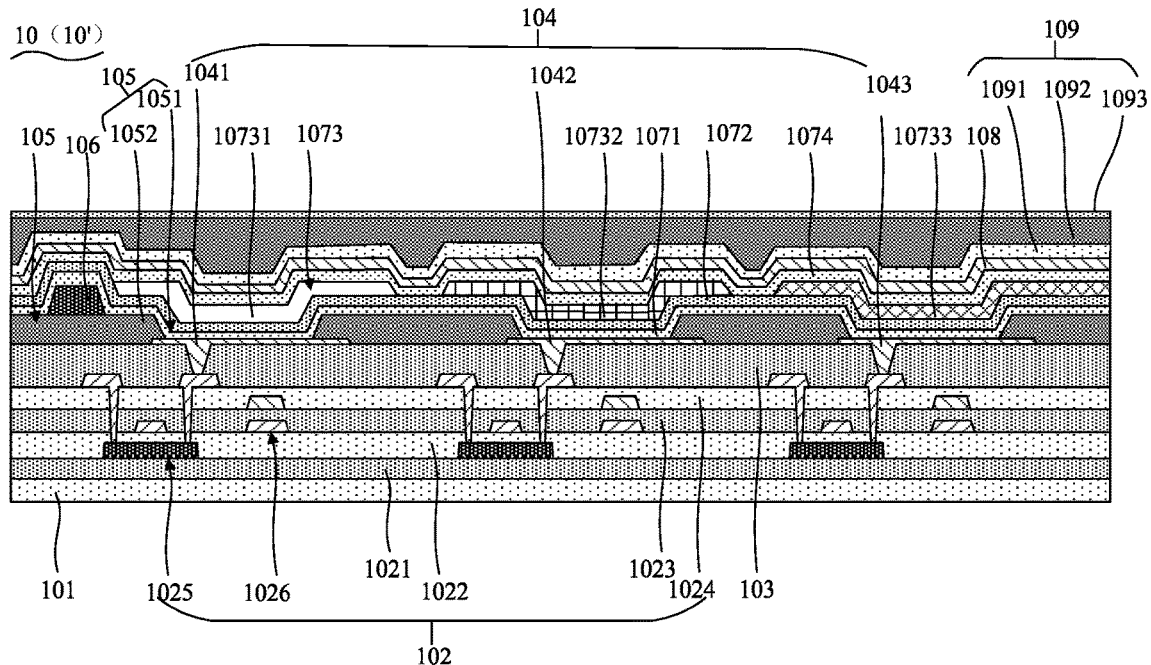
FIG. 25 is a schematic diagram of a film layer structure of a display panel according to an implementation of the present application.

As for a structure of a display panel 10 (10'), a specific display panel 10 (10') may be formed of a multi-layer film layer structure. FIG. 25 is a schematic diagram of a film layer structure of an exemplary display panel 10 (10') in which a pixel array may include a base substrate 101, a drive structure layer 102, a planarization layer 103, a first electrode pattern layer 104, a pixel definition layer 105, a post spacer 106, an organic function layer 107, a second electrode 108, and an encapsulation layer 109 that are stacked sequentially.

Fabrication of the display panel 10 (10') may specifically include the following acts.

(1) A base substrate 101 is prepared on a glass carrier plate.

In some implementations, the base substrate 101 may be a flexible base substrate, including, for example, a first flexible material layer, a first inorganic material layer, a semiconductor layer, a second flexible material layer, and a second inorganic material layer which are stacked on the glass carrier plate. The first flexible material layer and the second flexible material layer are made of Polyimide (PI), Polyethylene Terephthalate (PET) or a surface-treated polymer soft film or the like. The first inorganic material layer and the second inorganic material layer are made of Silicon Nitride (SiNx) or Silicon Oxide (SiOx), etc., which are used for improving water and oxygen resistance of the base substrate. The first inorganic material layer and the second inorganic material layer are also referred to as Barrier layers. A material of the semiconductor layer may be amorphous Silicon (a-Si). In some exemplary implementations, taking a laminated structure of PI1/Barrier1/a-Si/PI2/Barrier2 as an example, its preparation process includes: firstly, coating a layer of polyimide on the glass carrier plate, curing it into a film to form a first flexible (PI1) layer; then, depositing a layer of barrier thin film on the first flexible layer to form a first barrier (Barrier1) layer covering the first flexible layer; then depositing a layer of amorphous silicon thin film on the first barrier layer to form an amorphous silicon (a-Si) layer covering the first barrier layer; after that, coating a layer of polyimide on the amorphous silicon layer, curing it into a film to form a second flexible (PI2) layer; then, depositing a layer of barrier thin film on the second flexible layer to form a second barrier (Barrier2) layer covering the second flexible layer, thereby completing preparation of the base substrate 101.

(2) A drive structure layer 102 is prepared on the base substrate 101.

The drive structure layer 102 includes multiple drive circuits, and each drive circuit includes multiple transistors and at least one storage capacitor, such as a design of 2T1C, 3T1C, or 7T1C. Three sub-pixels are taken as an example for illustration, and a drive circuit of each sub-pixel is illustrated with only one transistor and one storage capacitor as an example.

In some embodiments, a preparation process of the drive structure layer may refer to following descriptions. A preparation process of a drive circuit of a red sub-pixel is described as an example.

A first insulation thin film and an active layer thin film are sequentially deposited on the base substrate 101, the active layer thin film is patterned through a patterning process to form a first insulation layer 1021 covering the entire base substrate 101 and a pattern of an active layer disposed on the first insulation layer 1021, wherein the pattern of the active layer includes at least a first active layer.

Then, a second insulation thin film and a first metal thin film are sequentially deposited, and the first metal thin film is patterned through a patterning process to form a second insulation layer 1022 covering the pattern of the active layer and a pattern of a first gate metal layer disposed on the second insulation layer 1022, wherein the pattern of the first gate metal layer includes at least a first gate electrode and a first capacitor electrode.

After that, a third insulation thin film and a second metal thin film are sequentially deposited, and the second metal thin film is patterned through a patterning process to form a third insulation layer 1023 covering the first gate metal layer and a pattern of a second gate metal layer disposed on the third insulation layer 1023, wherein the pattern of the second gate metal layer includes at least a second capacitor electrode, and a position of the second capacitor electrode corresponds to a position of the first capacitor electrode.

Then, a fourth insulation thin film is deposited, and the fourth insulation thin film is patterned through a patterning process to form a pattern of a fourth insulation layer 1024 covering the second gate metal layer, the fourth insulation layer 1024 is provided with at least two first vias, the fourth insulation layer 1024, the third insulation layer 1023, and the second insulation layer 1022 in the two first vias are etched away to expose a surface of the first active layer.

After that, a third metal thin film is deposited, and the third metal thin film is patterned through a patterning process, and a pattern of a source-drain metal layer is formed on the fourth insulation layer 1024, and the source-drain metal layer includes at least a first source electrode and a first drain electrode that are located in a display region. The first source electrode and the first drain electrode may be connected with the first active layer through a first via, respectively.

In the drive circuit of the red sub-pixel in the display region, the first active layer, the first gate electrode, the first source electrode, and the first drain electrode may constitute a first transistor 1025, and the first capacitor electrode and the second capacitor electrode may constitute a first storage capacitor 1026. In the above-mentioned preparation process, a drive circuit of a green sub-pixel and a drive circuit of a blue sub-pixel may be formed at the same time.

In some exemplary implementations, the first insulation layer 1021, the second insulation layer 1022, the third insulation layer 1023, and the fourth insulation layer 1024 are made of any one or more of Silicon Oxide (SiOx), Silicon Nitride (SiNx), and Silicon Oxynitride (SiON), and may be a single layer, a multi-layer, or a composite layer. The first insulation layer 1021 is referred to as a buffer layer, and is used for improving water and oxygen resistance of the base substrate. The second insulation layer 1022 and the third insulation layer 1023 are referred to as Gate Insulator (GI) layers. The fourth insulation layer 1024 is referred to as an Interlayer Dielectric (ILD) layer. The first metal thin film, the second metal thin film and the third metal thin film are made of metal materials, such as any one or more of Argentum (Ag), Copper (Cu), Aluminum (Al), Titanium (Ti), and Molybdenum (Mo), or an alloy material of the above-mentioned metals, such as an Aluminum-Neodymium alloy (AlNd) or a Molybdenum-Niobium alloy (MoNb), and may be a single-layer structure, or a multilayer composite structures such as Ti/Al/Ti. The active layer thin film is made of one or more of the materials such as amorphous Indium Gallium Zinc Oxide (a-IGZO), Zinc Oxynitride (ZnON), Indium Zinc Tin Oxide (IZTO), amorphous Silicon (a-Si), polysilicon (p-Si), hexathiophene, or polythiophene, etc. That is, the present disclosure is applicable to transistors that are fabricated based on oxide technology, silicon technology and organics technology.

(3) A planarization layer 103 is formed on the base substrate 101 on which the aforementioned patterns are formed.

In some exemplary implementations, a planarization thin film of an organic material is coated on the base substrate on which the aforementioned patterns are formed to form the Planarization (PLN) layer 103 covering the entire base substrate. Multiple second vias are formed on the planarization layer 103 of the display region through mask, exposure, and development processes. The planarization layer 103 in the multiple second vias is developed and removed, respectively exposing a surface of a first drain electrode of a first transistor 1025 of a drive circuit of a first sub-pixel 122 (122'), a surface of a first drain electrode of a first transistor 1025 of a drive circuit of a second sub-pixel 124 (124'), and a surface of a first drain electrode of a first transistor 1025 of a drive circuit of a third sub-pixel 126 (126').

(4) A first electrode pattern layer 104 is formed on the base substrate 101 on which the aforementioned patterns are formed. In some examples, a first electrode is an anode.

In some exemplary implementations, a conductive thin film is deposited on the base substrate 101 on which the aforementioned structures are formed, and the conductive thin film is patterned through a patterning process to form a first electrode pattern layer 104. A first anode 1041 of a first sub-pixel 122 (122') is connected with a first drain electrode of a first transistor 1025 through a second via, a second anode 1042 of a second sub-pixel 124 (124') is connected with a first drain electrode of a first transistor 1025 of the second sub-pixel 124 (124') through a second via, and a third anode 1043 of a third sub-pixel 126 (126') is connected with a first drain electrode of a first transistor 1025 of the third sub-pixel 126 (126') through a second via.

In some examples, the first electrode may be made of a metal material, such as any one or more of Magnesium (Mg), Argentum (Ag), Copper (Cu), Aluminum (Al), Titanium (Ti), and Molybdenum (Mo), or an alloy material of the above-mentioned metals, such as an Aluminum-Neodymium alloy (AlNd) or a Molybdenum-Niobium alloy (MoNb), and may be a single-layer structure, or a multilayer composite structure such as Ti/Al/Ti, or a stacked structure formed by a metal and a transparent conductive material, such as Indium Tin Oxide (ITO)/Ag/ITO, Mo/AlNd/ITO, and another reflective material.

(5) A pattern of a Pixel Definition Layer (PDL) 105 is formed on the base substrate 101 on which the aforementioned patterns are formed.

In some exemplary implementations, a pixel definition thin film is coated on the base substrate 101 on which the aforementioned patterns are formed, and a pattern of the pixel definition layer 105 is formed through mask, exposure, and development processes. The pixel definition layer 105 of the display region includes multiple sub-pixel definition parts 1052, and multiple pixel openings 1051 are formed between adjacent sub-pixel definition parts 1052. The pixel definition layers 105 in the multiple pixel openings 1051 are developed and removed, exposing at least part of a surface of a first anode 1041 of a first sub-pixel 122 (122'), at least part of a surface of a second anode 1042 of a second sub-pixel 124 (124'), and at least part of a surface of a third anode 1043 of a third sub-pixel 126 (126'), respectively.

In some examples, the pixel definition layer 105 may be made of polyimide, acrylic, or polyethylene terephthalate, etc.

It should be noted that, a shape and a size of each sub-pixel discussed in the implementations of the present application may refer to a shape and a size of a corresponding anode exposed from a pixel opening 1051 of the pixel definition layer 105, and further, geometric centers of various sub-pixels may be geometric centers of portions of corresponding anodes exposed from pixel openings 1051 of the pixel definition layer 105.

(6) A pattern of a Post Spacer (PS) 106 is formed on the base substrate 101 on which the aforementioned patterns are formed.

In some exemplary implementations, an organic material thin film is coated on the base substrate 101 on which the above-mentioned patterns are formed, and the pattern of the post spacer is formed through mask, exposure, and development processes. The post spacer 106 may serve as a support layer configured to support a Fine Metal Mask (FMM) during an evaporation process. In some examples, one repeating unit is arranged between two adjacent post spacers 106 along a row arrangement direction of sub-pixels, for example, a post spacer 106 may be located between a first sub-pixel 122 (122') and a second sub-pixel 124 (124') that are adjacent.

(7) An organic function layer 107 and a second electrode 108 are formed sequentially on the base substrate 101 on which the aforementioned patterns are formed. In some examples, the second electrode 108 may be a transparent cathode. Light may be emitted from a side of a light emitting element away from the base substrate 101 through the transparent cathode so as to achieve top emission. In some examples, an organic function layer 107 of a light emitting element includes: a hole injection layer 1071, a hole transport layer 1072, an emitting layer 1073, and an electron transport layer 1074.

In some exemplary implementations, a hole injection layer 1071 and a hole transport layer 1072 are formed sequentially through evaporation using an Open Mask on the base substrate 101 on which the aforementioned patterns are formed. Then a first emitting layer 10731, a second emitting layer 10732, and a third emitting layer 1073 are sequentially formed through evaporation using an FMM, and then an electron transport layer 1074, a cathode 108, and an optical coupling layer are formed sequentially through evaporation using an Open Mask. The hole injection layer 1071, the hole transport layer 1072, the electron transport layer 1074, and the cathode are all common layers of multiple sub-pixels. In some examples, the organic function layer may further include a microcavity adjustment layer located between the hole transport layer 1072 and the emitting layer 1073. For example, a first microcavity adjustment layer, a first emitting layer 10731, a second microcavity adjustment layer, a second emitting layer 10732, a third microcavity adjustment layer, and a third emitting layer 10733 may be formed sequentially through evaporation using an FMM after the hole transport layer 1072 is formed.

Figure 26:
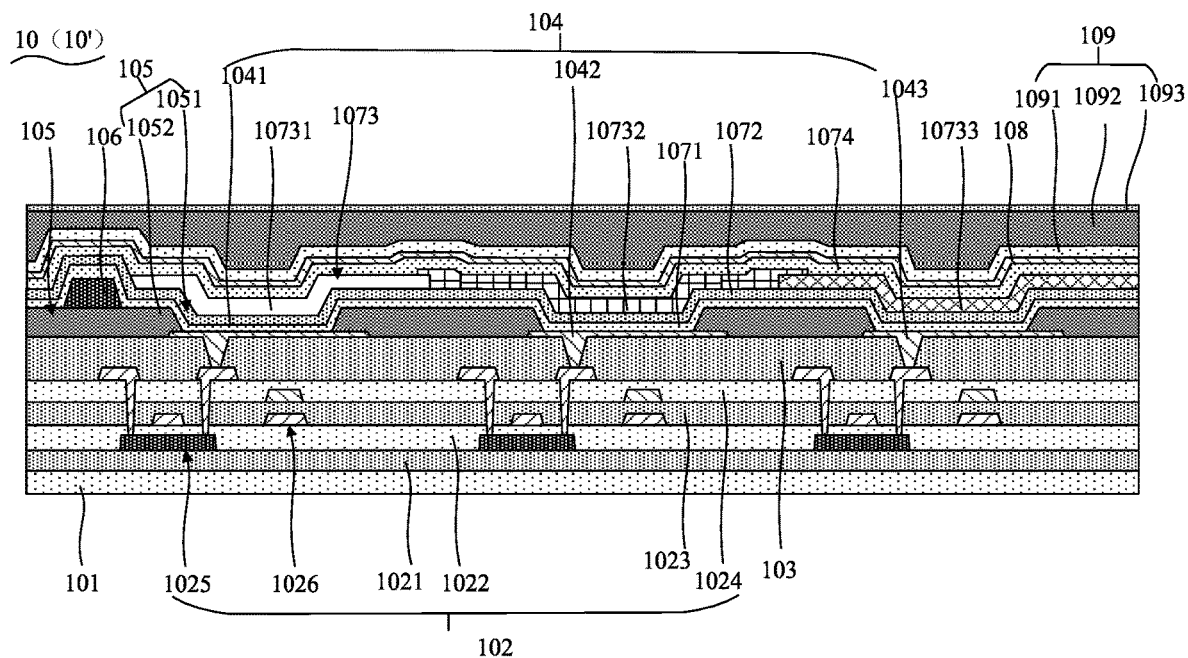
FIG. 26 is a schematic diagram of another film layer structure of a display panel according to an implementation of the present application.

In some exemplary implementations, as shown in FIG. 25, there may be no overlap among the first emitting layer 10731, the second emitting layer 10732, and the third emitting layer 10733 that are disposed adjacent to each other, that is, by selecting FMMs with different opening sizes, sizes of the formed emitting layer 1073 are also different. FIG. 26 is a schematic diagram of a film layer structure of another exemplary display panel 10 (10'). As may be seen from FIG. 26, there may be an overlap among the first emitting layer 10731, the second emitting layer 10732, and the third emitting layer 10733 which are formed through evaporation and disposed adjacent to each other due to a limitation of an opening of an FMM. In some exemplary implementations, the organic function layer 107 is formed in a sub-pixel region to implement a connection between the organic function layer and an anode. A cathode is formed on the pixel definition layer 105 and is connected with the organic function layer 107.

In some exemplary implementations, the cathode may be made of any one or more of Magnesium (Mg), Argentum (Ag), and Aluminum (Al), or an alloy made of any one or more of the above metals, or a transparent conductive material, such as Indium Tin Oxide (ITO), or a multi-layer composite structure of a metal and a transparent conductive material.

In some exemplary implementation, an optical coupling layer may be formed on a side of the cathode away from the base substrate 101, and the optical coupling layer may be a common layer of multiple sub-pixels. The optical coupling layer may be cooperated with a transparent cathode so as to increase light output. For example, a material of the optical coupling layer may be a semiconductor material. However, this embodiment is not limited thereto.

(8) An encapsulation layer 109 is formed on the base substrate 101 on which the aforementioned patterns are formed.

In some exemplary implementations, the encapsulation layer 109 is formed on the base substrate 101 on which the aforementioned patterns are formed. The encapsulation layer 109 includes a first encapsulation layer 1091, a second encapsulation layer 1092, and a third encapsulation layer 1093 which are stacked. The first encapsulation layer 1091 is made of an inorganic material, and covers the cathode in the display region. The second encapsulation layer 1092 is made of an organic material. The third encapsulation layer 1093 is made of an inorganic material and covers the first encapsulation layer 1091 and the second encapsulation layer 1092. However, this embodiment is not limited thereto. In some examples, the encapsulation layer may be a five-layer structure of inorganic/organic/inorganic/organic/inorganic.

In descriptions of the specification, descriptions of reference terms "one implementation", "some implementations", "an exemplary implementation", "an example", "a specific example", or "some examples" are intended to indicate that specific features, structures, materials, or characteristics described in connection with implementations or examples are contained in at least one implementation or example of the present application. In this specification, schematic expressions of the above terms do not necessarily refer to a same implementation or example. Moreover, the specific features, structures, materials, or characteristics described may be combined in any one or more implementations or examples in a proper way.

Although the implementations of the present application have been illustrated and described, those of ordinary skill in the art may understand that multiple changes, modifications, substitutions, and variations may be made to these implementations without departing from principles and concepts of the present application. The scope of the present application is defined by the claims and their equivalents.

The invention claimed is:

1. A display panel, comprising a plurality of pixel units arranged in an array, wherein each of the plurality of pixel units comprises a first sub-pixel, a second sub-pixel, and two third sub-pixels, the first sub-pixel, the second sub-pixel, and the two third sub-pixels are located within a virtual polygon, and a quantity of sides of the virtual polygon is greater than or equal to five;
the first sub-pixel is adjacent to the second sub-pixel, and both the two third sub-pixels are adjacent to the first sub-pixel and the second sub-pixel; and
pixel units adjacent in a column extension direction share the first sub-pixel and the second sub-pixel, and pixel units adjacent in a row extension direction share one of the third sub-pixels.

2. The display panel according to claim 1, wherein in the pixel unit, a distance between a geometric center of each of the third sub-pixels and a geometric center of the first sub-pixel is equal to a distance between the geometric center of the third sub-pixel and a geometric center of the second sub-pixel.

3. The display panel according to claim 1, wherein the virtual polygon is a virtual hexagon, the virtual hexagon comprises two opposite short sides which are perpendicular to the column extension direction, the first sub-pixel and the second sub-pixel are respectively disposed to fit the two short sides, and the two third sub-pixels are respectively disposed at two diagonal angles formed by other four sides of the virtual hexagon.

4. The display panel according to claim 3, wherein the two third sub-pixels are in mirror distribution with respect to a midline of a short side; or
the two third sub-pixels are symmetrically distributed with respect to a center of the virtual hexagon.

5. The display panel according to claim 1, wherein the pixel units are arranged in a rectangular lattice, virtual polygons where pixel units sharing the first sub-pixel or the second sub-pixel are located in the display panel intersect, and arrangement orders of first sub-pixels and second sub-pixels of pixel units in a same row in two adjacent columns of pixel units are reverse along column extension directions.

6. The display panel according to claim 1, wherein first sub-pixels and second sub-pixels of the plurality of pixel units are alternately arranged in row extension directions, and centers of first sub-pixels and centers of second sub-pixels in a same row are on a same straight line; or
first sub-pixels and second sub-pixels of the plurality of pixel units are alternately arranged in column extension directions, and centers of first sub-pixels and centers of second sub-pixels in a same column are on a same straight line.

7. The display panel according to claim 1, wherein a spacing between the first sub-pixel and the second sub-pixel and a spacing between the first sub-pixel and the third sub-pixel are equal.

8. A display panel, comprising a plurality of pixel units arranged in an array, wherein each of the plurality of pixel units comprises a first sub-pixel, a second sub-pixel, and two third sub-pixels, the first sub-pixel, the second sub-pixel, and the two third sub-pixels are located within a virtual polygon, and a quantity of sides of the virtual polygon is greater than or equal to five;
the first sub-pixel is adjacent to the second sub-pixel, and both the two third sub-pixels are adjacent to the first sub-pixel and the second sub-pixel; and
a geometric center of the first sub-pixel in the pixel unit has a same first distance from each of geometric centers of the two third sub-pixels, and a geometric center of the second sub-pixel has a same second distance from each of the geometric centers of the two third sub-pixels;
the geometric centers of the two third sub-pixels of the pixel unit have a first connection line, a ratio of a distance between the geometric center of the first sub-pixel and the first connection line to a distance between the geometric center of the second sub-pixel and the first connection line is a first preset value, a ratio of a maximum size of the first sub-pixel in a row extension direction to a maximum size of the second sub-pixel in the row extension direction is a second preset value, and the first preset value is smaller than the second preset value;

the geometric center of the first sub-pixel and the geometric center of the second sub-pixel in the pixel unit have a second connection line, a farthest distance between two straight lines passing through the first sub-pixel and the second sub-pixel along a direction parallel to the second connection line but not through the third sub-pixels is a third distance, in the pixel unit the geometric center of the first sub-pixel and a geometric center of the third sub-pixel have a third connection line, a farthest distance between two straight lines passing through the first sub-pixel and the third sub-pixel along a direction parallel to the third connection line but not through the second sub-pixel is a fourth distance, and a ratio of the third distance to the fourth distance is less than 1.5.

9. The display panel according to claim 8, wherein the first distance and the second distance are not equal.

10. The display panel according to claim 8, wherein a shape of the pixel unit is designed as axis symmetry; or the two third sub-pixels in the pixel unit are designed symmetrically with respect to a line where the geometric center of the first sub-pixel and the geometric center of the second sub-pixel are located; or a shape of the first sub-pixel is designed as axis symmetry; or a shape of the second sub-pixel is designed as axis symmetry.

11. The display panel according to claim 8, wherein the first sub-pixel in the pixel unit comprises a side adjacent to a third sub-pixel, the side forms an included angle with an extension direction of the adjacent third sub-pixel, an angle range of the included angle is greater than or equal to 0° and less than or equal to 30°.

12. The display panel according to claim 8, wherein in the pixel unit, a size of a side of the first sub-pixel close to the second sub-pixel in the row extension direction is smaller than that of a side of the first sub-pixel away from the second sub-pixel in the row extension direction.

13. The display panel according to claim 8, wherein in the pixel unit, a connection line of a geometric center of one of the third sub-pixels and the geometric center of the second sub-pixel forms a first angle with a connection line of the geometric center of the second sub-pixel and a geometric center of the other one of the third sub-pixels, and a range of the first angle is 60° to 150°.

14. The display panel according to claim 13, wherein in the pixel unit, a connection line of the geometric center of one of the third sub-pixels and the geometric center of the first sub-pixel forms a second angle with a connection line of the geometric center of the first sub-pixel and the geometric center of the other one of the third sub-pixels, and the second angle is larger than the first angle.

15. The display panel according to claim 8, wherein a sum of mutually adjacent internal angles of the first sub-pixel, the second sub-pixel, and the two third sub-pixels in the pixel unit ranges from 300° to 400°.

16. The display panel according to claim 8, wherein in the pixel unit, a projection of the first sub-pixel along the row extension direction is overlapped with a projection of the third sub-pixel along the row extension direction, a portion where the projection of the first sub-pixel along the row extension direction is overlapped with the projection of the third sub-pixel along the row extension direction is larger than a portion where the projection of the first sub-pixel along the row extension direction is not overlapped with the projection of the third sub-pixel along the row extension direction.

17. The display panel according to claim 8, wherein the virtual polygon is a virtual pentagon, a first side of the first sub-pixel is disposed along a first side of the virtual pentagon, a second side and a third side of the first sub-pixel are respectively disposed opposite to first sides of the two third sub-pixels, second sides of the two third sub-pixels are respectively disposed along a second side and a third side of the virtual pentagon, third sides of the two third sub-pixels are respectively disposed along a fourth side and a fifth side of the virtual pentagon, and fourth sides of the two third sub-pixels are disposed opposite to the second sub-pixel.

18. The display panel according to claim 8, wherein the virtual polygon is a virtual pentagon, a first side of the first sub-pixel is disposed along a first side of the virtual pentagon, a second side and a third side of the first sub-pixel are respectively disposed opposite to first sides of the two third sub-pixels, a fourth side of the first sub-pixel is disposed opposite to a first side of the second sub-pixel, second sides of the two third sub-pixels are respectively disposed along a second side and a third side of the virtual pentagon, third sides of the two third sub-pixels are respectively disposed along a fourth side and a fifth side of the virtual pentagon, fourth sides of the two third sub-pixels are disposed opposite to a second side and a third side of the second sub-pixel, respectively, and a fourth side and a fifth side of the second sub-pixel are disposed along the fourth side and the fifth side of the virtual pentagon, respectively;

or the virtual polygon is a virtual hexagon, a first side of the first sub-pixel is disposed along a first side of the virtual hexagon, a second side and a third side of the first sub-pixel are respectively disposed opposite to first sides of the two third sub-pixels, second sides of the two third sub-pixels are respectively disposed along a second side and a third side of the virtual hexagon, third sides of the two third sub-pixels are respectively disposed along a fourth side and a fifth side of the virtual hexagon, fourth sides of the two third sub-pixels are disposed opposite to a first side and a second side of the second sub-pixel, a third side and a fourth side of the second sub-pixel are disposed along the fourth side and the fifth side of the virtual hexagon, respectively, and a fifth side of the second sub-pixel is disposed along a sixth side of the virtual hexagon.

19. The display panel according to claim 18, wherein a ratio of a length of the second side of the third sub-pixel to a length of the fourth side of the third sub-pixel ranges from 0.5 to 2.

20. The display panel according to claim 8, wherein the pixel units are arranged in a rectangular lattice or a triangular lattice, virtual polygons in which various pixel units in the display panel are located do not intersect with each other, and first sub-pixels and second sub-pixels in the pixel units are arranged in a same order along column extension directions;

or the pixel units are arranged in a rectangular lattice, virtual polygons in which various pixel units in the display panel are located do not intersect with each other, and arrangement orders of first sub-pixels and second sub-pixels of pixel units in a same row in two adjacent columns of pixel units along column extension directions are reverse.

\* \* \* \* \*